US007091738B2

(12) United States Patent
Nakano et al.

(10) Patent No.: US 7,091,738 B2
(45) Date of Patent: Aug. 15, 2006

(54) INSPECTION SYSTEM FOR ACTIVE MATRIX PANEL, INSPECTION METHOD FOR ACTIVE MATRIX PANEL AND MANUFACTURING METHOD FOR ACTIVE MATRIX OLED PANEL

(75) Inventors: Dalju Nakano, Sagamihara (JP); Yoshitami Sakaguchi, Hadano (JP)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 10/902,752

(22) Filed: Jul. 29, 2004

(65) Prior Publication Data

US 2005/0088198 A1 Apr. 28, 2005

(30) Foreign Application Priority Data

Oct. 28, 2003 (JP) ............................ 2003-368947

(51) Int. Cl.
*G01R 31/00* (2006.01)

(52) U.S. Cl. ...................................................... 324/770

(58) Field of Classification Search ..................... None
See application file for complete search history.

(56) References Cited

U.S. PATENT DOCUMENTS

| | | | | |
|---|---|---|---|---|
| 1,537,490 | A * | 5/1925 | Oman | 324/545 |
| 2,653,298 | A * | 9/1953 | McKinley | 324/695 |
| 3,254,298 | A * | 5/1966 | Ellis et al. | 324/210 |
| 3,393,799 | A * | 7/1968 | Schmersal | 209/527 |
| 3,915,850 | A * | 10/1975 | Crownover | 209/560 |
| 4,046,258 | A * | 9/1977 | Damm | 209/524 |
| 5,309,108 | A * | 5/1994 | Maeda et al. | 324/501 |
| 5,596,283 | A * | 1/1997 | Mellitz et al. | 324/754 |
| 6,040,705 | A * | 3/2000 | Garcia et al. | 324/762 |
| 6,714,028 | B1 * | 3/2004 | Garcia et al. | 324/754 |
| 6,853,426 | B1 * | 2/2005 | Koike et al. | 349/126 |
| 2004/0198182 | A1 * | 10/2004 | Kuan et al. | 451/5 |
| 2005/0056127 | A1 * | 3/2005 | Yamabuchi et al. | 83/13 |

FOREIGN PATENT DOCUMENTS

| | | |
|---|---|---|
| JP | 63-5377 | 1/1988 |
| JP | 2002-072918 | 3/2002 |
| JP | 2002-108243 | 4/2002 |
| JP | 2005134421 A * | 5/2005 |

* cited by examiner

*Primary Examiner*—Jermele Hollington
(74) *Attorney, Agent, or Firm*—Gibb I.P. Law Firm, LLC; Daniel E. Johnson

(57) ABSTRACT

An inspection system for inspecting characteristics of an active matrix panel before formation of OLEDs includes: a roller contact probe having a conductive material on at least a surface thereof and sequentially contacting pixel electrodes formed on the active matrix panel while rotating; probe control circuits having capability to apply a voltage necessary for measurement to TFT arrays including pixel electrodes with which the roller contact probe is in contact; and a computer measuring currents flowing through the TFT arrays to which a voltage is applied and statistically processing the measurement results.

20 Claims, 27 Drawing Sheets

FIG. 3(a) GRID ARRANGEMENT
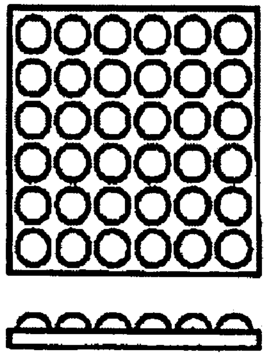
FIG. 3(b) ZIGZAG ARRANGEMENT
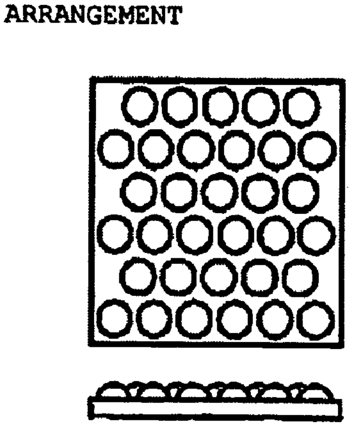
FIG. 3(c) CURVED LINE ARRANGEMENT
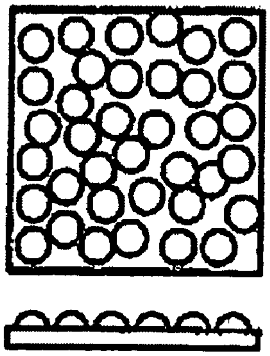

FIG. 4(a) LINEAR LINE ARRANGEMENT
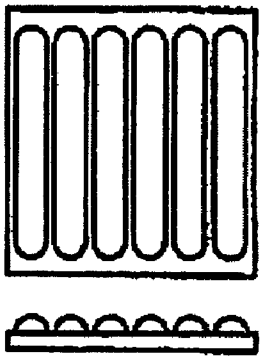
FIG. 4(b) OBLIQUE LINE ARRANGEMENT
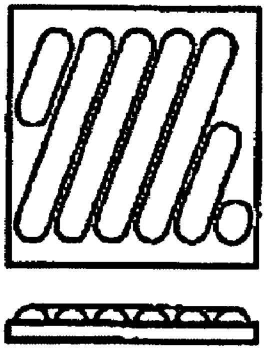
FIG. 4(c) CURVED LINE ARRANGEMENT
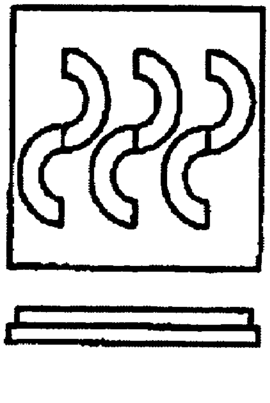

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | 1 |
| 1 | 0 | 0 | 0 | 0 | 0 | 0 | 0 | 0 | 0 | 0 | 0 | 0 | 0 | 0 | 0 |
| 2 | | | | | | | | | | | | | | | |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 1 | 1 | 1 | 1 | 1 | 1 | 1 | 1 | 1 | 1 | 1 | 1 | 1 | 1 | 1 |
| 2 | 0 | 0 | 0 | 0 | 0 | 0 | 0 | 0 | 0 | 0 | 0 | 0 | 0 | 0 | 0 |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 1 | 1 | 1 | 1 | 1 | 1 | 1 | 1 | 1 | 1 | 1 | 1 | 1 | 1 | 1 |
| 3 | 0 | 0 | 0 | 0 | 0 | 0 | 0 | 0 | 0 | 0 | 0 | 0 | 0 | 0 | 0 |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 1 | 1 | 1 | 1 | 1 | 1 | 1 | 1 | 1 | 1 | 1 | 1 | 1 | 1 | 1 |
| 4 | 0 | 0 | 0 | 0 | 0 | 0 | 0 | 0 | 0 | 0 | 0 | 0 | 0 | 0 | 0 |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 1 | 1 | 1 | 1 | 1 | 1 | 1 | 1 | 1 | 1 | 1 | 1 | 1 | 1 | 1 |
| 5 | 0 | 0 | 0 | 0 | 0 | 0 | 0 | 0 | 0 | 0 | 0 | 0 | 0 | 0 | 0 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 2 | 2 | 2 | 2 | 2 | 2 | 2 | 2 | 2 | 2 | 2 | 2 | 2 | 2 |
| 5 | 1 | 1 | 1 | 1 | 1 | 1 | 1 | 1 | 1 | 1 | 1 | 1 | 1 | 1 | 1 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 2 | 2 | 2 | 2 | 2 | 2 | 2 | 2 | 2 | 2 | 2 | 2 | 2 | 2 |
| 5 | 2 | 2 | 2 | 2 | 2 | 2 | 2 | 2 | 2 | 2 | 2 | 2 | 2 | 2 | 2 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 1 | 0 | 0 | 1 | 1 | 1 | 1 | 1 | 1 | 1 | 1 | 1 | 1 | 1 | 1 |
| 1 | 0 | 0 | 0 | 0 | 0 | 0 | 0 | 0 | 0 | 0 | 0 | 0 | 0 | 0 | 0 |
| 2 | | | | | | | | | | | | | | | |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 1 | 1 | 1 | 1 | 1 | 1 | 1 | 1 | 1 | 1 | 1 | 1 | 1 | 1 | 1 |
| 2 | 0 | 0 | 0 | 0 | 0 | 0 | 0 | 0 | 0 | 0 | 0 | 0 | 0 | 0 | 0 |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 1 | 1 | 1 | 1 | 1 | 1 | 1 | 1 | 1 | 1 | 1 | 1 | 1 | 1 | 1 |
| 3 | 0 | 0 | 0 | 0 | 0 | 0 | 0 | 0 | 0 | 0 | 0 | 0 | 0 | 0 | 0 |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 1 | 1 | 1 | 1 | 1 | 1 | 1 | 1 | 1 | 1 | 1 | 1 | 1 | 1 | 1 |
| 4 | 0 | 0 | 0 | 0 | 0 | 0 | 0 | 0 | 0 | 0 | 0 | 0 | 0 | 0 | 0 |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 1 | 0 | 0 | 1 | 1 | 1 | 1 | 1 | 1 | 1 | 1 | 1 | 1 | 1 | 1 |
| 5 | 0 | 0 | 0 | 0 | 0 | 0 | 0 | 0 | 0 | 0 | 0 | 0 | 0 | 0 | 0 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 0 | 0 | 2 | 2 | 2 | 2 | 2 | 2 | 2 | 2 | 2 | 2 | 2 | 2 |
| 5 | 1 | 1 | 1 | 1 | 1 | 1 | 1 | 1 | 1 | 1 | 1 | 1 | 1 | 1 | 1 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 0 | 0 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 0 | 0 | 2 | 2 | 2 | 2 | 2 | 2 | 2 | 2 | 2 | 2 | 2 | 2 |
| 5 | 2 | 2 | 2 | 2 | 2 | 2 | 2 | 2 | 2 | 2 | 2 | 2 | 2 | 2 | 2 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 0 | 0 | 0 | 0 | 0 | 0 | 0 | 0 | 0 | 0 | 1 | 1 | 1 | 1 | 1 |
| 1 | 0 | 0 | 0 | 0 | 0 | 0 | 0 | 0 | 0 | 0 | 0 | 0 | 0 | 0 | 0 |
| 2 | | | | | | | | | | | | | | | |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 1 | 1 | 1 | 1 | 1 | 1 | 1 | 1 | 1 | 2 | 2 | 2 | 2 | 2 | 2 |
| 1 | 0 | 0 | 0 | 0 | 0 | 0 | 0 | 0 | 0 | 1 | 1 | 1 | 1 | 1 | 1 |
| 2 | 0 | 0 | 0 | 0 | 0 | 0 | 0 | 0 | 0 | 0 | 0 | 0 | 0 | 0 | 0 |
| 3 | | | | | | | | | | | | | | | |
| 4 | | | | | | | | | | | | | | | |
| 5 | | | | | | | | | | | | | | | |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 1 | 1 | 1 | 1 | 1 | 1 | 1 | 1 | 1 | 2 | 2 | 2 | 2 | 2 | 2 |
| 2 | 0 | 0 | 0 | 0 | 0 | 0 | 0 | 0 | 0 | 1 | 1 | 1 | 1 | 1 | 1 |
| 3 | 0 | 0 | 0 | 0 | 0 | 0 | 0 | 0 | 0 | 0 | 0 | 0 | 0 | 0 | 0 |
| 4 | | | | | | | | | | | | | | | |
| 5 | | | | | | | | | | | | | | | |

FIG. 16(d)
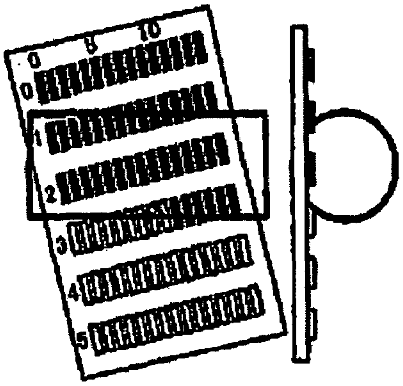
| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 1 | 1 | 1 | 1 | 1 | 1 | 1 | 1 | 1 | 2 | 2 | 2 | 2 | 2 | 2 |
| 3 | 0 | 0 | 0 | 0 | 0 | 0 | 0 | 0 | 0 | 1 | 1 | 1 | 1 | 1 | 1 |
| 4 | 0 | 0 | 0 | 0 | 0 | 0 | 0 | 0 | 0 | 0 | 0 | 0 | 0 | 0 | 0 |
| 5 | | | | | | | | | | | | | | | |
FIG. 16(e)
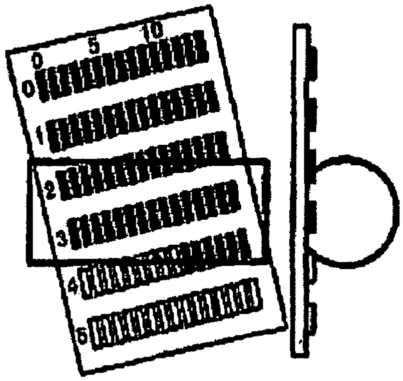
| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 1 | 1 | 1 | 1 | 1 | 1 | 1 | 1 | 1 | 2 | 2 | 2 | 2 | 2 | 2 |
| 4 | 0 | 0 | 0 | 0 | 0 | 0 | 0 | 0 | 0 | 1 | 1 | 1 | 1 | 1 | 1 |
| 5 | | | | | | | | | | | | | | | |
FIG. (16f)
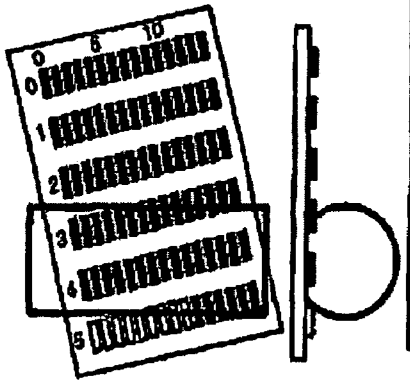
| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 1 | 1 | 1 | 1 | 1 | 1 | 1 | 1 | 1 | 2 | 2 | 2 | 2 | 2 | 2 |
| 5 | 0 | 0 | 0 | 0 | 0 | 0 | 0 | 0 | 0 | 1 | 1 | 1 | 1 | 1 | 1 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 2 | 2 | 2 | 2 | 2 | 2 | 2 | 2 | 2 | 2 | 2 | 2 | 2 | 2 |
| 5 | 1 | 1 | 1 | 1 | 1 | 1 | 1 | 1 | 1 | 2 | 2 | 2 | 2 | 2 | 2 |

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0 | 2 | 2 | 2 | 2 | 2 | 2 | 2 | 2 | 2 | 2 | 2 | 2 | 2 | 2 | 2 |
| 1 | 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 | 2 |
| 3 | 2 | 2 | 2 | 2 | 2 | 2 | 2 | 2 | 2 | 2 | 2 | 2 | 2 | 2 | 2 |
| 4 | 2 | 2 | 2 | 2 | 2 | 2 | 2 | 2 | 2 | 2 | 2 | 2 | 2 | 2 | 2 |
| 5 | 2 | 2 | 2 | 2 | 2 | 2 | 2 | 2 | 2 | 2 | 2 | 2 | 2 | 2 | 2 |

FIG. 21(b) AMLCD
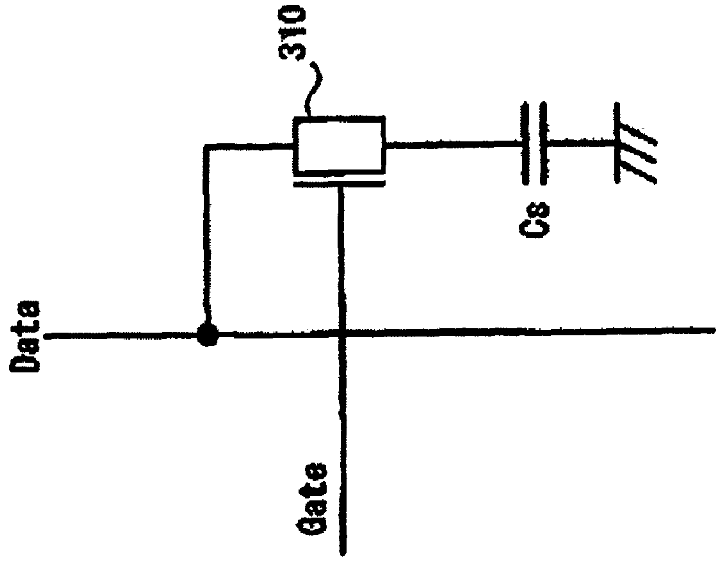
FIG. 21(a) AMOLED
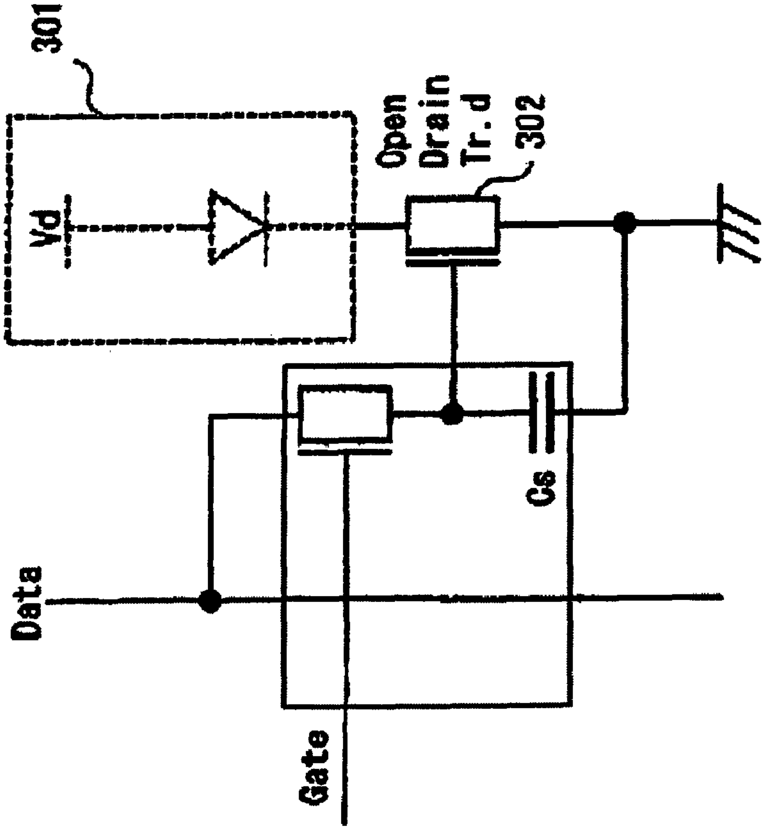

INSPECTION SYSTEM FOR ACTIVE MATRIX PANEL, INSPECTION METHOD FOR ACTIVE MATRIX PANEL AND MANUFACTURING METHOD FOR ACTIVE MATRIX OLED PANEL

BACKGROUND OF THE INVENTION

The present invention relates to an inspection system and the like for an active matrix panel in used such as an organic EL and an inorganic EL, and more particularly to an inspection system and the like for performing inspection by causing a probe to contact pixel electrodes.

Recently, of various display panels, an EL panel incorporating therein an organic EL (Electro Luminescence) or an inorganic EL has been increasingly attracting attention. An EL device is a chemical material, self-emitting when electrified, and is capable of emitting lights of different colors by altering a chemical structure thereof. The EL device has been studied for various applications. Among other devices, the EL device (hereinafter, referred to as an OLED (Organic Light Emitting Diode)) is caused to emit light when fluorescent organic compound excited by applying an electric field thereto is charged with direct current. The EL device has been attracting attention as a next generation display device in terms of achievement of thin depth, wide viewing angle, wide Gamut and the like. Methods for driving the OLED include a passive matrix type and an active matrix type. To pursue a larger screen and a higher resolution display, the active drive type is preferable in terms of materials, life time, cross-talk. For the active drive type, generally, a TFT (Thin Film Transistor) drive method has been employed.

Then, an active matrix OLED (AMOLED) and an active matrix liquid crystal display (AMLCD) be explained while comparing those two devices with each other. FIGS. 21(*a*) and 21(*b*) are diagrams to explain and compare pixel circuits for an AMOLED and an AMLCD. FIG. 21(*a*) illustrates a pixel circuit for an AMOLED, and FIG. 21(*b*) illustrates a pixel circuit for an AMLCD. Referring to FIG. 21(*b*), a TFT 310 connected to a data line and a gate line constitutes a pixel circuit for a TFT array. In the AMOLED shown in FIG. 21(*a*), a driver TFT 302 as a drive transistor having an open drain configuration is, disposed adjacent to, and connected to, a pixel capacitor of a circuit similar to that shown in FIG. 21(*b*), and an OLED 301 as a light emitting device is connected to the driver TFT 302. The AMLCD of FIG. 21(*b*) is capable of altering gradation merely by generating a voltage in the TFT 310 therein. The AMOLED, when a prescribed voltage is applied to the driver TFT 302 therein, alters brightness of the OLED 301 depending on the quantity of current flowing through the OLED. It is likely that a threshold voltage Vth of the driver TFT 302 varies even if the process is adjusted. In case of occurrence of the variations, even when the same voltage is applied to the TFT, currents flowing through the TFT is different from one another in quantity, causing variations in the brightness. For this reason, when functions of TFT arrays for an AMOLED panel are inspected, in addition to checking whether interconnects are open or short circuited, it is important to check whether characteristics of the driver TFTs 302 for driving the OLEDs 301 are uniform throughout the entire panel. This inspection is to confirm that a compensation circuit for the driver TFTs 302 functions normally, and that the Vths of the driver TFTs 302 on the panel are uniform.

To reduce manufacturing cost of a conventional AMOLED panel, TFT arrays are required to be inspected as a single unit so that only a non-defective unit is sent forwards to the subsequent step, such as a step of forming an OLED. In the manufacture of AMOLED panel, currently, yield of TFT arrays for a conventional AMOLED is not sufficiently high, and materials for the OLEDs 301 themselves are expensive. In addition, it takes longer time for the OLED 301, among other things, to be manufactured. For those reasons and others, before manufacturing the OLEDs 301, it is desirable to measure the Vths of the driver TFTs 302. However, with regard to the TFT array as a single unit, OLEDs as components of pixel circuits are not yet mounted thereon, and the driver TFT has an open drain configuration. That is, in steps before the mounting of OLEDs, the OLED 301 as denoted by a broken line of FIG. 21(*a*) is not connected and does not constitute a normal circuit. Accordingly, it is basically impossible to pass current through the driver TFT 302, and inspection and the like of functions of a Vth compensation circuit normally functions cannot be performed as long as the OLED 301 is not connected. To inspect such a driver TFT 302, an approach to applying a voltage to an electrode in an open state from outside or an approach to pulling down a potential of the electrode to a GND (ground) is needed.

For example, as a conventional technology described in the patent publication, an inspection method has been proposed in which TFT arrays are immersed in electrolytic solution, and are made electrically conductive, and then, a voltage is applied to the arrays (e.g., refer to a patent-related reference 1). Furthermore, another inspection method has been described in which, for example, before formation of a pattern of pixel electrodes, a conductive film for inspection is formed on an upper portion of the pixel electrodes to perform inspection and the film is removed after the inspection (e.g., refer to a patent-related reference 2). Moreover, although a technology has nothing to do with solution to technical problems, the technology has been proposed in which a cylinder-shaped rotatable probe is caused to contact interconnect extensions while being rotated, and accordingly electrical characteristics of electrodes are inspected (e. g., refer to a patent-related reference 3).

[patent-related reference 1] Japanese Unexamined Patent Publication 2002-72918 (pp. 4–5, FIG. 1)

[patent-related reference 2] Japanese Unexamined Patent Publication 2002-108243 (pp. 8–9, FIG. 1)

[patent-related reference 3] Japanese Patent Laid-Opened Official Gazette No. SHO-63-5377 (pp. 2–3, FIG. 1)

However, according to the technique disclosed in the patent-related reference 2, the conductive film for inspection is formed layered on the upper portion of TFT arrays and closely contacts the pixel electrodes. Accordingly, in practice, the step of forming the conductive film on the upper portion of the TFT arrays and the step of removing the film have large adverse effect on the TFT arrays, and it is highly likely that damage is caused to surfaces of pixel electrode circuits with high probability. Furthermore, according to the technique disclosed in the patent-related reference 1, the TFT arrays need to be immersed in electrolytic solution and therefore it can be concluded that the technique is not practical.

Additionally, when semiconductor components are inspected, a probe system (prober) is employed as a system for making electrical contact. This probe system, made of needles such as thin metal needles and conductive rubber needles, causes the needles to contact electrode pads for inspection. As a probe head used in a conventional probe system, for example, a contact probe formed by integrally molding resin of anisotropically conductive material has been proposed. An example is a probe designed to allow electrical conduction only between upper and lower projections for contact. Moreover, when semiconductor components are inspected, contacts to tens to hundreds of electrodes make the inspection sufficient. Thus, elasticity of spring and rubber, tension of metal needles as well as pressurization by using pressure of the surrounding atmosphere enable the contacts to be made securely. However, in the case of an AMOLED panel, contacts should be made to more than hundred thousands of electrodes arranged in a matrix, and therefore it is difficult to apply equal pressure to all the probes. By contrast, a system is also conceived which causes individual inspection needles to be independently controlled to apply pressure to individual pixels. However, a system for making contacts to more than hundred thousands of electrodes is very difficult to assemble, and becomes expensive. The patent-related reference 3 only discloses a technique for pressing a probe against interconnect extensions, and never discloses a technique for making direct contact to electrodes arranged in a matrix. Therefore, the technique disclosed in the reference 3 never addresses the problems arising when TFT arrays for OLEDs are inspected before formation of the OLED and cannot be utilized to solve the problems.

SUMMARY OF THE INVENTION

The present invention has been aimed at solving the above-described technical problems, and an object of the invention is to provide an inspection system, for the active matrix panel, which inspects electrical characteristics while making direct contact to electrodes arranged in a matrix.

Furthermore, another object of the invention is to reduce adverse effect due to contact failure even when a probe is caused to directly contact pixel electrodes, and further to reduce adverse effect of contacts by the probe on pixel electrodes.

Yet another object of the invention is to enable, for example, a curved, sheet-shaped substrate to be inspected by pressing a rotatable probe against pixel electrodes.

Still another object of the invention is to obtain measurement results with high accuracy by using results from measuring pixel circuits arranged in a matrix at a plurality of times, by inspecting based on an statistical approach, and with causal characteristics taken into consideration.

In order to achieve the above-stated objects, the present invention relates to an inspection system for inspecting characteristics of an active matrix panel before formation of OLEDs (Organic Light Emitting Diodes), and includes: a rotatable probe, at least whose surface is made of a conductive material, and which sequentially contacts pixel electrodes formed on the active matrix panel while being rotated; voltage application means capable of applying a voltage necessary for measurement to TFT arrays including pixel electrodes with which the rotatable probe is in contact; current measurement means measuring currents flowing through the TFT arrays to which a voltage is applied by the voltage application means; and processing means statistically processing results obtained by sequentially measured currents using the current measurement means.

In this case, since the processing means is characterized in that the means records the number of measurements performed for each of the TFT arrays by the current measurement means, it is an advantage that determination on cause of abnormalities is facilitated by statistical processing. Moreover, since the rotatable probe is characterized in that the probe is made of a roller-shaped member and has projections and depressions in the surface thereof, occurrence of contact failure due to bending or other conditions of panel is suppressed. Furthermore, the projections and depressions of the rotatable probe are characterized in that they are shaped like at least one of pyramid, sphere and trench. Still furthermore, the rotatable probe is characterized in that the probe is formed of a roller-shaped member and is configured to be able to contact a plurality of lines of pixel electrodes at a time.

Additionally, the invention relates to an active matrix panel inspection method for inspecting an active matrix panel before formation of OLED (Organic Light Emitting Diode), and includes: a step of rotating a rotatable probe controlled so as to electrically serve as a power supply or a GND and of causing the rotatable probe to sequentially contact pixel electrodes of pixels to be measured on the active matrix panel; a step of scanning select lines to select lines on the active matrix panel; a step of applying a measurement voltage to data line synchronized with the scanning of the select lines; and a step of observing current flowing through a driver TFT of the pixel, to be measured, to which the measurement voltage is applied.

In this case, the step of observing current is characterized in that in the step, a plurality of measurement values are obtained from each of the pixels to be measured.

Moreover, the method is characterized in that the method further includes: a step of mapping the number of measurements observed in the step of observing current; and a step of identifying abnormalities in pixel circuits constituting the active matrix panel through use of measurement results being mapped and/or abnormalities in the rotatable probe.

Furthermore, the method is characterized in that the method further includes a step of detecting abnormalities in the rotatable probe by identifying periodically repeated states depending on a shape of the rotatable probe, based on results obtained by observing current in the step of observing current.

An active matrix panel inspection method, to which the invention is applied, according to another aspect of the invention includes: a step of causing a probe to sequentially contact pixel electrodes of pixels to be measured in the active matrix panel; a step of obtaining results from measuring current flowing through the pixel to be measured at a plurality of times; a step of detecting abnormalities using the results obtained by the plurality of measurements; and a step of, through statistically processing the results of the plurality of measurements, determining whether the detected abnormalities are due to defects in the pixels to be measured or due to defects in the probe. In this case, the step of determining is characterized in that the step includes outputting a map of the number of measurements represented in a matrix of lines and columns, and, when the detected abnormalities are periodically repeated abnormalities depending on a shape of the probe, and determining the detected abnormalities are due to abnormalities in the probe.

Moreover, a method, to which the invention is applied, for manufacturing an active matrix OLED panel, is characterized in that the method includes: an array step of producing an active matrix panel by forming TFT arrays on a substrate; an inspection step of inspecting functions of the produced active matrix panel; and a cell step of mounting OLEDs on an active matrix panel determined to be non-defective in the inspection step, which includes rotating a rotatable probe made of a conductive material, causing the rotatable probe to sequentially contact pixel electrodes of pixels to be measured on the active matrix panel, and inspecting functions by observing currents flowing through the pixels, to be measured, constituting the active matrix panel. In this case, the inspection step is characterized in that the step includes recording, for each pixel, results from measuring the pixels, to be measured, constituting the active matrix panel, and in that the pixels to be measured are inspected while confirming performance of the rotatable probe based on the recorded number of measurements.

BRIEF DESCRIPTION OF THE DRAWINGS

For a more complete understanding of the present invention and the advantages thereof, reference is now made to the following description taken in conjunction with the accompanying drawings, in which;

FIGS. 3(*a*) to 3(*c*) are diagrams illustrating an example of the roller surface of the roller contact probe;

FIGS. 4(*a*) to 4(*c*) are diagrams illustrating an example of the roller surface of the roller contact probe;

FIGS. 12(*d*) to 12(*f*) are diagrams to explain how the roller contact probe moves and inspection process proceeds in case of FIG. 11;

FIG. 12(*g*) is a diagram to explain how the roller contact probe moves and inspection process proceeds in case of FIG. 11;

FIGS. 14(*d*) to 14(*f*) are diagrams to explain how the roller contact probe moves and inspection process proceeds in the case shown in FIG. 13;

FIG. 14(*g*) is a diagram to explain how the roller contact probe moves and inspection process proceeds in the case shown in FIG. 13;

FIGS. 16(*d*) to 16(*f*) are diagrams to explain how the roller contact probe moves and inspection process proceeds in the case shown in FIG. 15;

FIGS. 16(*g*) and 16(*h*) are diagrams to explain how the roller contact probe moves and inspection process proceeds in the case shown in FIG. 15;

FIGS. 21(*a*) and 21(*b*) are diagrams to explain and compare pixel circuits for AMOLED and AMLCD.

DETAILED DESCRIPTION OF THE PREFERRED EMBODIMENT

An embodiment of the invention will be explained in detail below with reference to the attached drawings.

Figure 1:
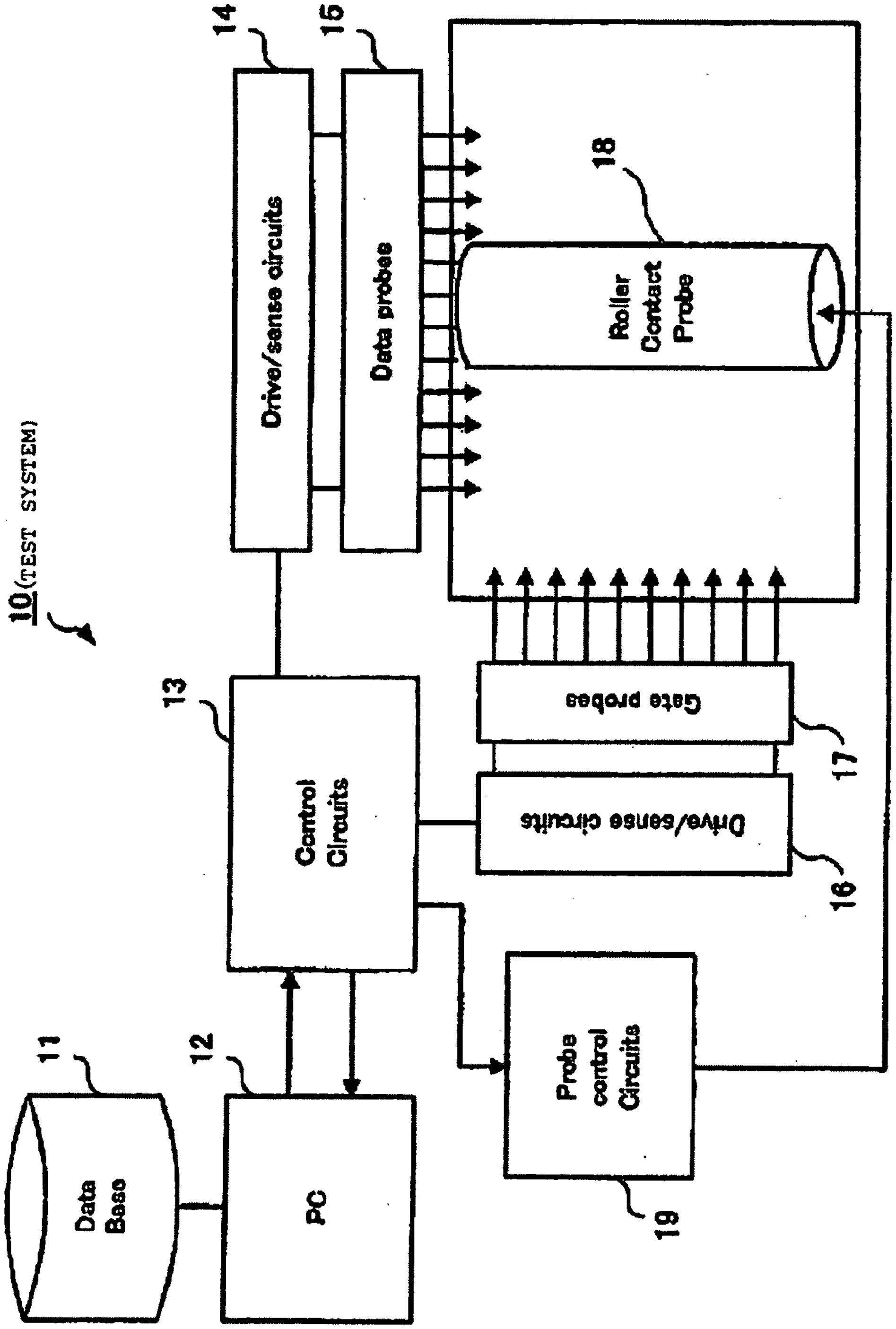
FIG. 1 is a diagram to explain the configuration of a test system as an inspection system for an active matrix panel (TFT array substrate) to which the embodiment is applied.

FIG. 1 is a diagram to explain the configuration of a test system 10 as a system for inspecting an active matrix panel (TFT array substrate) to which the embodiment of the present invention is applied. The test system 10 includes a data base 11, a computer (PC) 12, control circuits 13, drive/sense circuits 14, data probes 15, drive/sense circuits 16, gate probes 17, a roller contact probe 18, and probe control circuits 19.

The data base 11 of the test system 10 stores information needed to determine whether individual TFT arrays to be inspected are non-defective or defective and information necessary for measurement. The computer 12 includes, for example, a PC and the like, and in response to inputted data, executes determination processing based on the information stored in the data base 11. The control circuits 13 manage a sequence of measurements for inspection. Furthermore, the drive/sense circuits 14 and 16 are analog circuits for generating a signal to drive an AMOLED and further for acquiring a waveform produced by measurement of TFT arrays. The drive/sense circuits 14 and 16 are mounted with a later-described integration circuit thereon. The data probes 15 and 17 supply an AMOLED drive signal produced by the drive/sense circuits 14 and 16 to the TFT arrays to be measured, and acquire a waveform produced by measurement of TFT arrays. The roller contact probe 18 is formed of a conductive material, and contacts pixel electrodes disposed in a surface of a panel of the TFT arrays to be measured while rotating. Moreover, the probe control circuits 19 control operation of the roller contact probe 18, and further control a power supply voltage supplied to the roller contact probe 18.

In the embodiment of the present invention, the roller contact probe 18 is rotated in a direction of lines of the active matrix panel, and further all of the pixel electrodes are caused to securely contact the roller contact probe 18 while contact pressure applied against the electrodes by the roller contact probe 18 is controlled, thereby enabling all the pixels to sequentially be inspected. Moreover, since the roller contact probe 18 is formed shaped like a roller, the probe 18 is caused to make close contacts with pixel electrodes in only a few lines simultaneously, enabling uniform pressure to easily be applied. Additionally, since the roller contact probe 18 performs contact with, and removal from, the electrodes while rotating, the probe is easily removed and is accordingly capable of minimizing load on the pixel electrodes.

In the test system 10, a sequence of measurements for inspection are managed by the control circuits 13. The AMOLED drive signal is generated by the drive/sense circuits 14 and 16 and then supplied to the TFT arrays via the probes 15 and 17. Furthermore, the roller contact probe 18 is managed by the probe control circuits 19, which in turn is managed by the control circuits 13, and is operated synchronized with the sequence of measurements. The waveform produced by measurement of TFT arrays is inputted to the drive/sense circuits 14 and 16 via the probes 15 and 17, or is inputted to the roller contact probe 18 to be observed. To this end, a circuit for measurement of current is mounted on the drive/sense circuits 14 and 16 or on the probe control circuits 19. A signal observed is converted to digital data by the control circuits 13, and is inputted to the computer 12. The computer 12 processes data measured, and determines whether the TFT arrays are non-defective or defective while referring to the information stored in the database 11. Additionally, if needed, data necessary for determination through use of statistical approach is displayed, outputted, and so on.

Figure 2:
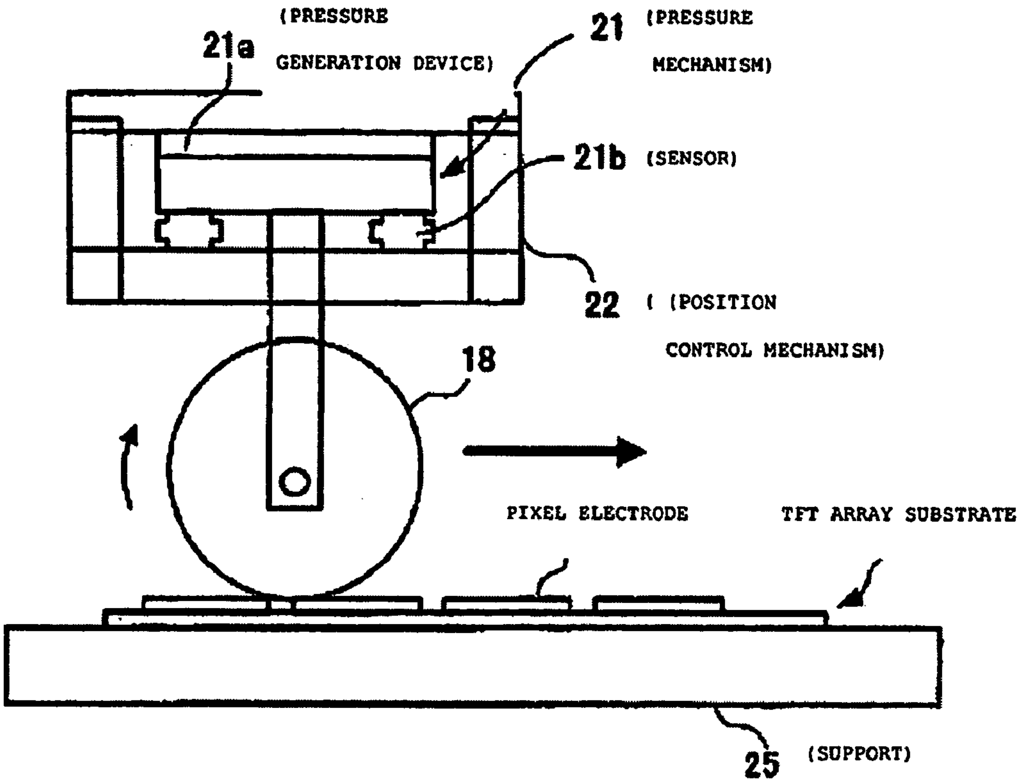
FIG. 2 is a diagram illustrating the exemplary configuration of a roller contact probe.
Figure 5A:
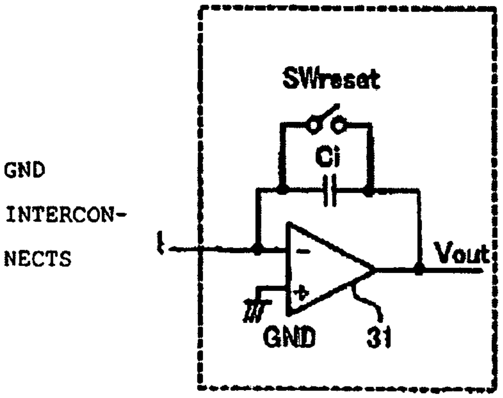
FIGS. 5(*a*) to 5(*d*) are diagrams illustrating an exemplary circuit available for measurement of current.
Figure 5B:
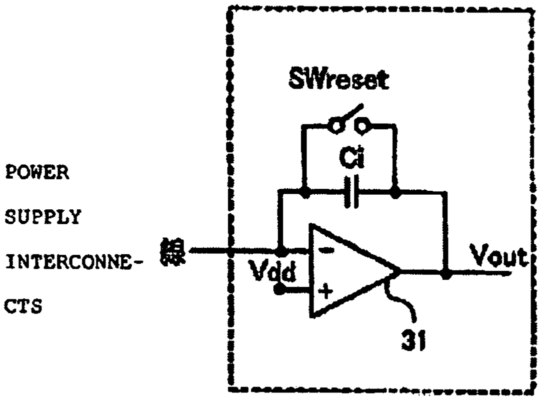
Figure 5C:
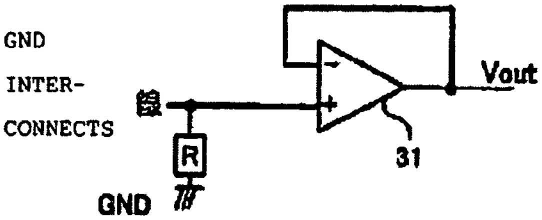
Figure 5D:
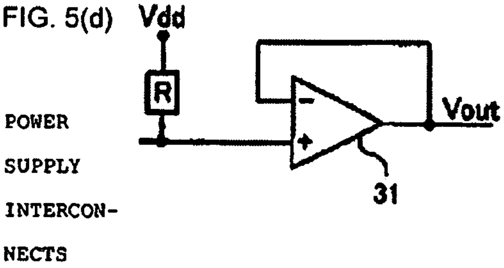

FIG. 2 is a diagram illustrating an example of configuration of the roller contact probe 18. The roller contact probe 18 functions as means for making contact to the pixel electrodes of a TFT array substrate while preventing damage to the TFT array substrate to be measured. To this end, the roller contact probe 18 is provided with control mechanisms such as a pressure mechanism 21, a position control mechanism 22, and a not-illustrated movement mechanism. Using such control mechanisms, the roller contact probe 18 is configured to be able to contact the pixel electrodes of the TFT array substrate provided on a support 25. When a conductive rubber or the like is disposed throughout the entire TFT arrays instead of employing the configuration shown in FIG. 2, pressure needs to be uniformly applied to a wide range of the area. Furthermore, when the conductive rubber or the like is removed after inspection of TFT arrays, it is highly likely that tension in a vertical direction is loaded on the surface of the pixel circuits, and that the tension damages the surface of the pixel circuits. Accordingly, as shown in FIG. 2, the roller contact probe 18, namely a roller-shaped electrode made of a soft, conductive material such as conductive rubber and a conductive organic material, is configured to make contact to the surface (i.e., an exposed surface of electrodes for connection to OLEDs) of the AMOLED panel. When the probe is formed to be shaped like a roller, the area with which the probe is in contact can be limited to pixels in a few lines or so, and accordingly contact pressure can easily be controlled. By this, contact resistance between the roller contact probe 18 and the pixel electrodes can be even. Moreover, the moving of the roller contact probe 18 on the panel while being rotated allows sequential inspection of pixel circuits.

The pressure mechanism 21 shown in FIG. 2 generates pressure using a pressure generation device 21*a* that utilizes elasticity or tension of springs, screw force, or pressure of a gas. Moreover, a sensor 21*b* for measuring the pressure generated is additionally mounted on the mechanism and feeds back the pressure measured to the pressure generation device 21*a* so that the pressure generated falls within a standard range of pressure. The position control mechanism 22 performs positional adjustment in triaxial directions and angular adjustment in biaxial directions. AMOLED pixel size varies depending on resolution to be achieved and an AMOLED pixel is rectangular, one by three, in shape where a minor side thereof is approximately 50 μm to 100 μm in length. When the radius of curvature of the roller contact probe 18 is set sufficiently large, the probe is able to contact at least ten lines at a time. For example, when the probe is able to contact ten lines at a time, the contact angle can be maintained within a range from −3 to +3 degrees, and therefore even a generally-used angle control device can sufficiently serve for this purpose. The radius of curvature of the surface of the roller is preferably large. It is desirable that the movement mechanism is a mechanism for simultaneously rotating and moving the roller contact probe 18, the pressure mechanism 21, the position control mechanism 22 and the like on the substrate. A generally employed type of movement mechanism, such as a screw type of, bearing type of, and air float type of movement mechanism may be employed. Additionally, the support 25 which supports the TFT array substrate may be moved instead.

The roller surface of the roller contact probe 18 may be a smooth, curved surface, and it is preferable that the roller surface has projections and depressions. When the probe has the projections and depressions on the surface thereof, contact failure due to bending of the substrate can be prevented, and the probe can make secure contacts with the pixel electrodes.

FIGS. 3(*a*) to 3(*c*) and FIGS. 4(*a*) to 4(*c*) are diagrams illustrating examples of the roller surface of the roller contact probe 18.

FIGS. 3(*a*) to 3(*c*) illustrate examples having projections and depressions which are independent from one another, and the projection and depression may be either of spherical and coned in shape. Examples of arrangement of the projections and depressions may include a grid arrangement shown in FIG. 3(*a*), a zigzag arrangement shown in FIG. 3(*b*), and a random arrangement shown in FIG. 3(*c*). It is preferable that an average distance (pitch) between a projection and a depression is smaller than the pitch of the pixel electrodes for AMOLEDs, and it is also preferable that the pitch is within the range from 10 μm to 100 μm with precision required in the manufacture taken into consideration.

Each of FIGS. 4(*a*) to 4C(c) illustrates an example of the roller surface having ridge-shaped projections. Types of ridge-shaped projections to be formed on the roller surface may include, for example, a linear line arrangement shown in FIG. 4(*a*), an oblique line arrangement shown in FIG. 4(*b*), and a curved line arrangement shown in FIG. 4(*c*). All of those arrangements of FIGS. 3(*a*) to 3(*c*) and FIGS. 4(*a*) to 4(*c*) are shown as a development elevation, and such arrangements are formed so as to be wound around the roller surface. It is preferable that the pitch between the ridge-shaped projection is smaller than the pitch of the pixel electrodes for AMOLEDs, and it is also preferable that the pitch is within the range from 10 μm to 100 μm with precision required in the manufacture taken into consideration.

Then, an example of a circuit used for measurement of current will be explained.

Each of FIGS. 5(*a*) to 5(*d*) is a diagram illustrating an example of a circuit available for measurement of current, which is mounted, for example, on the drive/sense circuits 14 and 16, or the probe control circuits 19. FIG. 5(*a*) illustrates an integration circuit connected to GND interconnects for measurement, FIG. 5(*b*) illustrates an integration circuit connected to power supply interconnects for measurement, FIG. 5(*c*) illustrates a current measurement circuit connected to GND interconnects for measurement, and FIG.

5(*d*) illustrates a current measurement circuit connected to power supply interconnects for measurement.

Each of the integration circuit shown in each of FIGS. 5(*a*) and 5(*b*) comprises an operational amplifier 31, a capacitor Ci, and a rest switch SWreset. Note that operation of the integration circuit is also described in detail in U.S. Pat. No. 5,179,345. Each of the current measurement circuits shown in each of FIGS. 5(*c*) and 5(*d*) includes a minute resistor R for monitoring current in addition to the operational amplifier 31. Outputs from the integration circuit and the current measurement circuit shown in FIGS. 5(*a*) to 5(*d*) are converted to digital data by an A/D converter provided in the measurement control circuit 13 shown in FIG. 1, and are sent forwards to the computer 12.

Subsequently, an actual inspection method will be explained.

Each of FIGS. 6(*a*) to 6(*d*) is a diagram illustrating an example of a pixel circuit to be inspected. FIG. 6(*a*) illustrates a voltage programming circuit consisting of two TFTs according to Brody, and the configuration of the circuit is currently dominant. FIG. 6(*b*) illustrates a voltage programming circuit having a Vth compensation function and consisting of four TFTs according to Dawson. Furthermore, FIG. 6(*c*) illustrates a current programming circuit having a Vth compensation function and consisting of four TFTs according to Dawson. FIG. 6(*d*) illustrates a current programming circuit using current mirroring configuration and consisting of four TFTs. Each of these pixel circuits can be configured to have a n-channel transistor, a p-channel transistor as a driver TFT transistor. In each of the pixel circuits shown in FIGS. 6(*a*) to 6(*d*), a driver TFT denoted by T2(*n*) or T2(*p*) is employed and a pixel electrode is connected thereto.

The pixel electrode is connected to a drain or a source of the driver TFT. When OLEDs are deposited, an anode or a cathode is disposed opposite to the pixel electrode, and accordingly the driver TFT is enabled to supply current to the corresponding OLED. When the roller contact probe 18 is caused to contact the pixel electrodes, the roller contact probe 18 can be used as an alternative to electrodes, disposed opposite to each other, having the OLEDs in between. In the case of FIG. 6(*a*), the roller contact probe 18 is electrically controlled so as to serve as a power supply. In the case of FIGS. 6(*b*) to 6(*d*), the roller contact probe 18 is electrically controlled so as to serve as a GND.

Figure 6A:
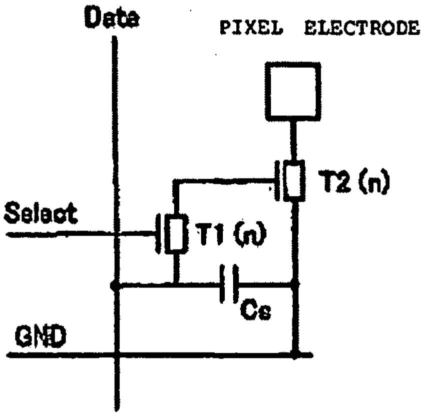
FIGS. 6(*a*) to 6(*d*) are diagrams illustrating an exemplary pixel circuit to be inspected.
Figure 6B:
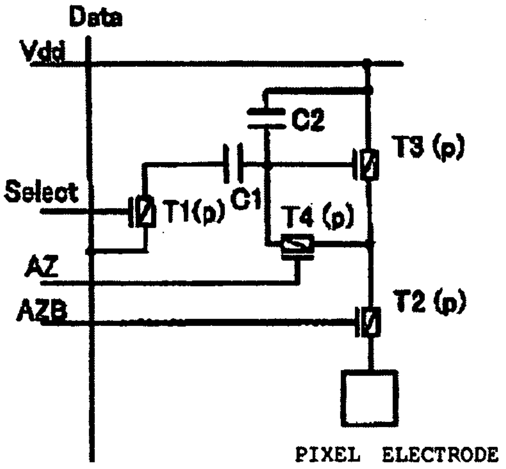
Figure 6C:
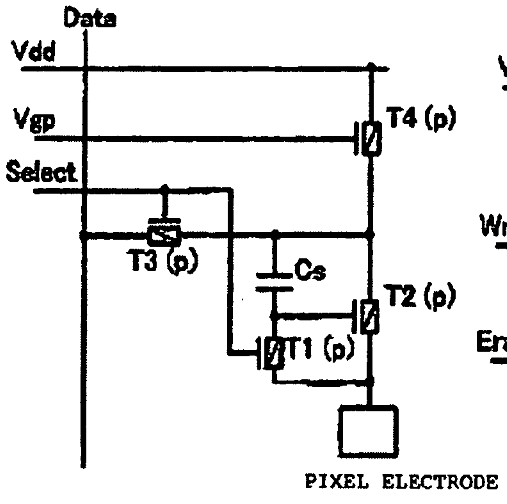
Figure 6D:
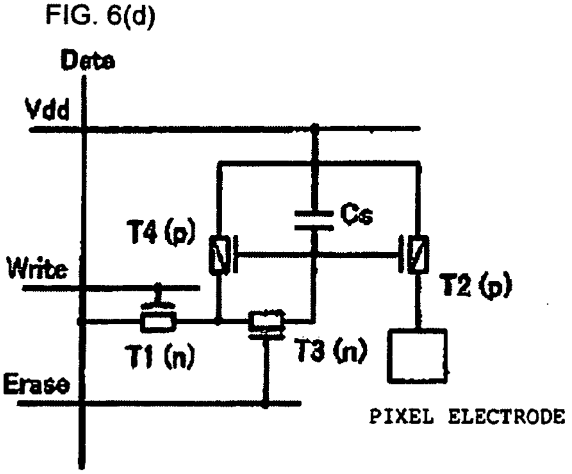

How the electrical characteristics of the driver TFTs according to the embodiment of the present invention are inspected will be explained with reference to an example of the pixel circuit shown in FIG. 6A.

Figure 7:
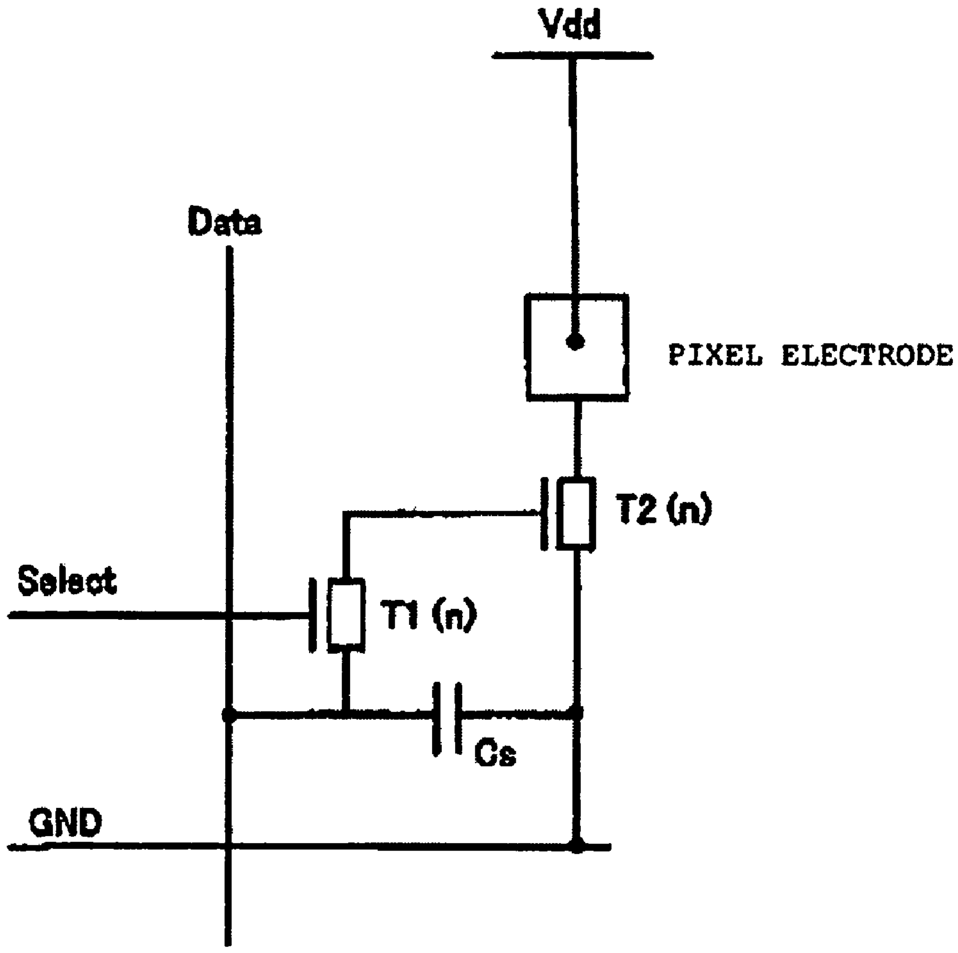
FIG. 7 is a diagram illustrating a state where contact with the pixel electrode is made by the roller contact probe and a power supply (Vdd) is supplied to the pixel electrode.

FIG. 7 is a diagram illustrating a state that the roller contact probe 18 contacts the pixel electrodes, and that a power supply voltage (Vdd) is supplied. A select line which is on the same line that the roller contact probe 18 contacts is activated to turn on a pixel select TFT (T1). While this state is maintained, a video voltage is applied to a data line to generate a gate-source voltage (Vgs) of a driver TFT (T2). Since the power supply voltage (Vdd) is supplied to a drain electrode of the driver TFT (T2), a drain-source voltage (Vds) of the driver TFT (T2) is established. At this point, when a circuit capable of measuring current (e.g., the integration circuits and current measurement circuits shown in FIGS. 5(*a*) to 5(*d*)) is connected to the roller contact probe 18 or GND interconnects on the TFT array, drain-source current (Id) of the driver TFT (T2) can be measured.

Figure 8:
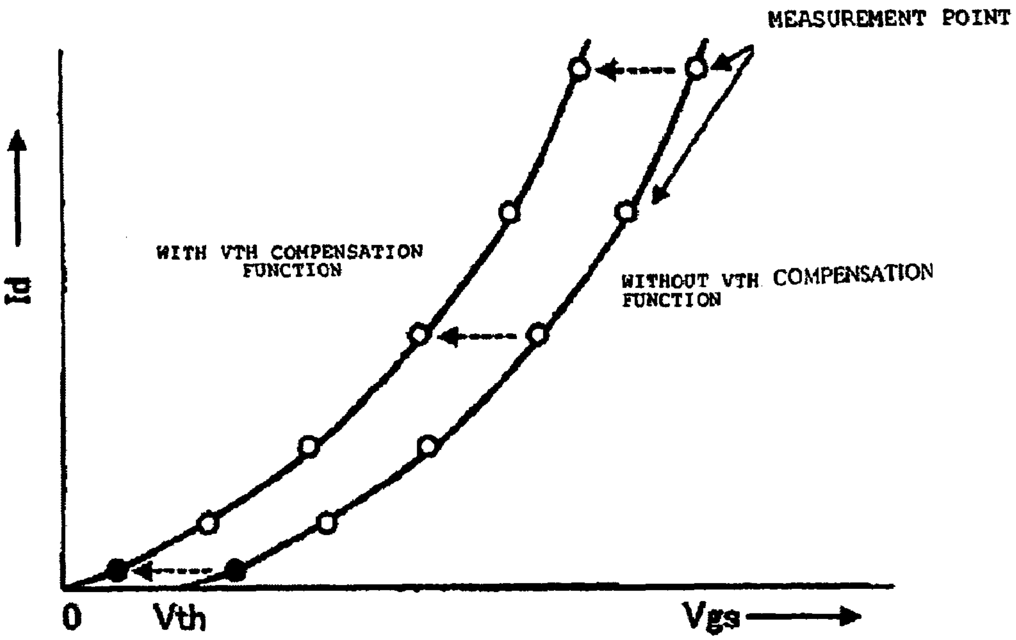
FIG. 8 is a diagram illustrating Vgs-Id curves (characteristic curves) determined by measuring the drain-source current (Id) varying with a plurality of gate-source voltages (Vgs)

FIG. 8 is a diagram illustrating Vgs-Id curves (characteristic curves) determined by measuring the drain-source current (Id) varying with a plurality of gate-source voltages (Vgs). In the diagram, an abscissa denotes a gate-source voltage (Vgs), and an ordinate denotes a drain-source current (Id). The pixel circuits shown in FIGS. 6(*b*) to 6(*d*) also can be similarly measured. In FIG. 8, results obtained by measuring the pixel circuit with a Vth compensation function is also shown.

Figure 9:
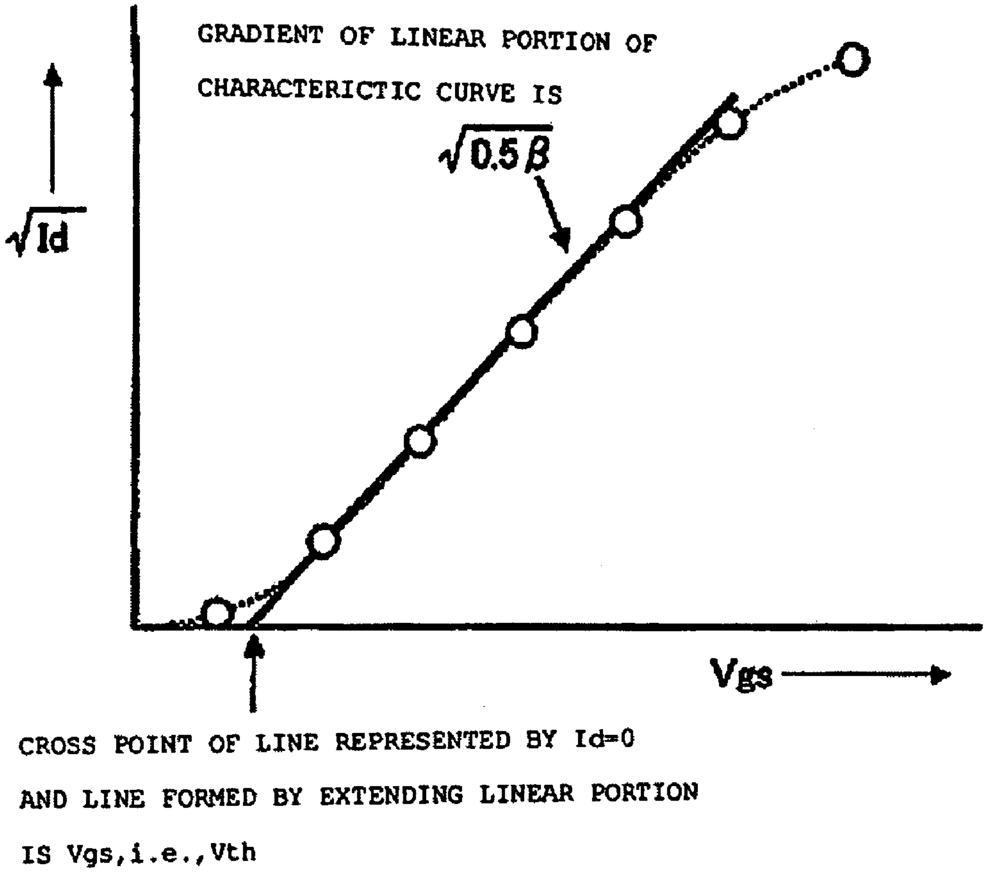
FIG. 9 is a diagram illustrating a characteristic curve determined by computing the square root of Id of the Vgs-Id curve determined as indicated in FIG. 8.

FIG. 9 is a diagram illustrating a characteristic curve determined by computing the square root of Id of the Vgs-Id curve determined as indicated in FIG. 8. Computing the square root of the drain-source current (Id) provides the curve shown in FIG. 9, and the Vth and β of the driver TFT can be easily determined. That is, a gate-source voltage (Vgs) denoted by a cross point at which a line represented by Id=0 and a line formed by extending a linear portion of the characteristic curve intersects with each other is a Vth, and the gradient of the linear portion of the characteristic curve is $(0.5 \text{ times } \beta)^{1/2}$. When inspection is performed by computing a Vth and a β of the driver TFT contained in each of the pixels, variations in electrical characteristics of the driver TFTs can be determined and, also, whether the driver TFTs are non-defective or defective can be determined.

Figure 10:
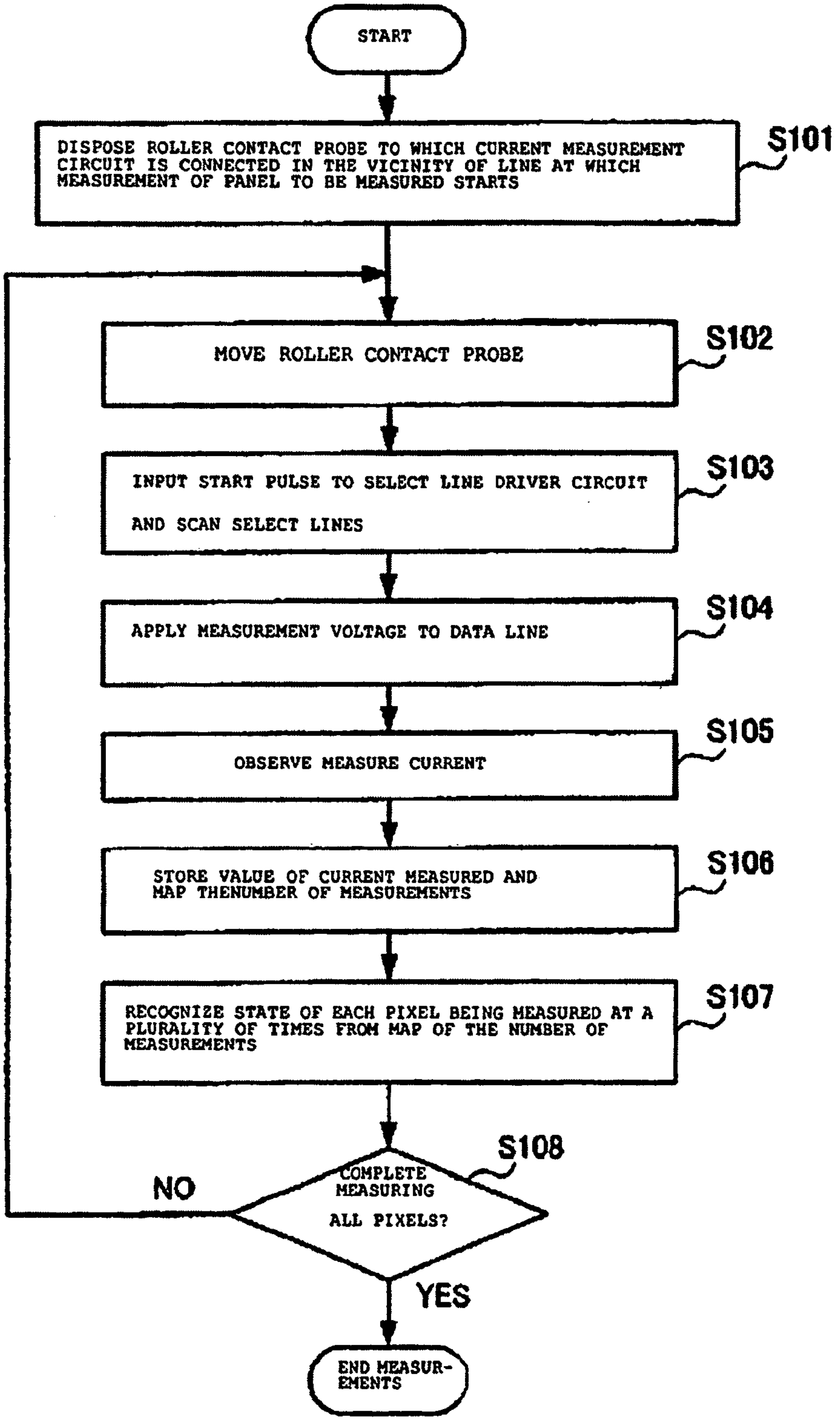
FIG. 10 is a flow chart illustrating how inspection process to which the embodiment is applied proceeds.

FIG. 10 is a flow chart illustrating the sequence of an inspection process to which the embodiment is applied.

First, when inspection is performed, the roller contact probe 18 to which the circuit for measuring current is connected is disposed in the vicinity of a measurement start line at which measurement of a panel to be measured starts (step S101). Thereafter, the roller contact probe 18 is moved (step S102). The speed of the movement of the roller contact probe 18 is set lower than the speed at which the select lines are scanned. At this point, a start pulse is inputted to a select line driver circuit, and the select lines (step S103) are scanned. The start pulse is inputted at intervals longer than the duration for which the roller contact probe 18 is in contact with the number of lines at a time. Furthermore, a measurement voltage is applied to data lines synchronized with the scanning of the select lines (step S104).

After the roller contact probe 18 contacts the measurement start line, current measurement is performed until measurement of all of the pixel circuits is completed. That is, for example, the control circuits 13 as an inspection device perform observation of current measured through use of the circuit, shown in each of FIGS. 5(*a*) to 5(*d*), for measuring current (step S105). For example, the control circuits 13 as an inspection device stores the value of current determined by measuring each of the pixel circuits, and counts the number of current measurements performed on each of the pixel circuits, and map (described later) the number of the measurements (step S106). Furthermore, the mapping of the number of the measurements, which map is to be prepared, provides information indicative of the state of the pixel circuits on which a plurality of measurements of current have been performed (step S107). The control circuits 13 determine whether all of the plurality of current measurements to be performed on each of the pixel circuits have been completed (step S108). When all the measurements have not been completed, the process returns to step S102, and an operation of inputting the start pulse to the select line driver circuit while moving the roller contact probe 18 is repeated. In step S108, when the measurements to be performed for all the select lines have been completed, the measurement is terminated. Note that the above inspection process proceeds using the following facts. That is, the select line driver circuit (drive/sense circuits 14, 16) is generally comprised of a shift register, and therefore problems never occur even when the inputting of a plurality of start pulses is performed. Further, only the pixel circuits with which the roller contact probe 18 is in contact allow current to flow therethrough even when a plurality of select lines on the panel (TFT array substrate) are being activated.

Thereafter, detection of contact failure will be explained.

Figure 11:
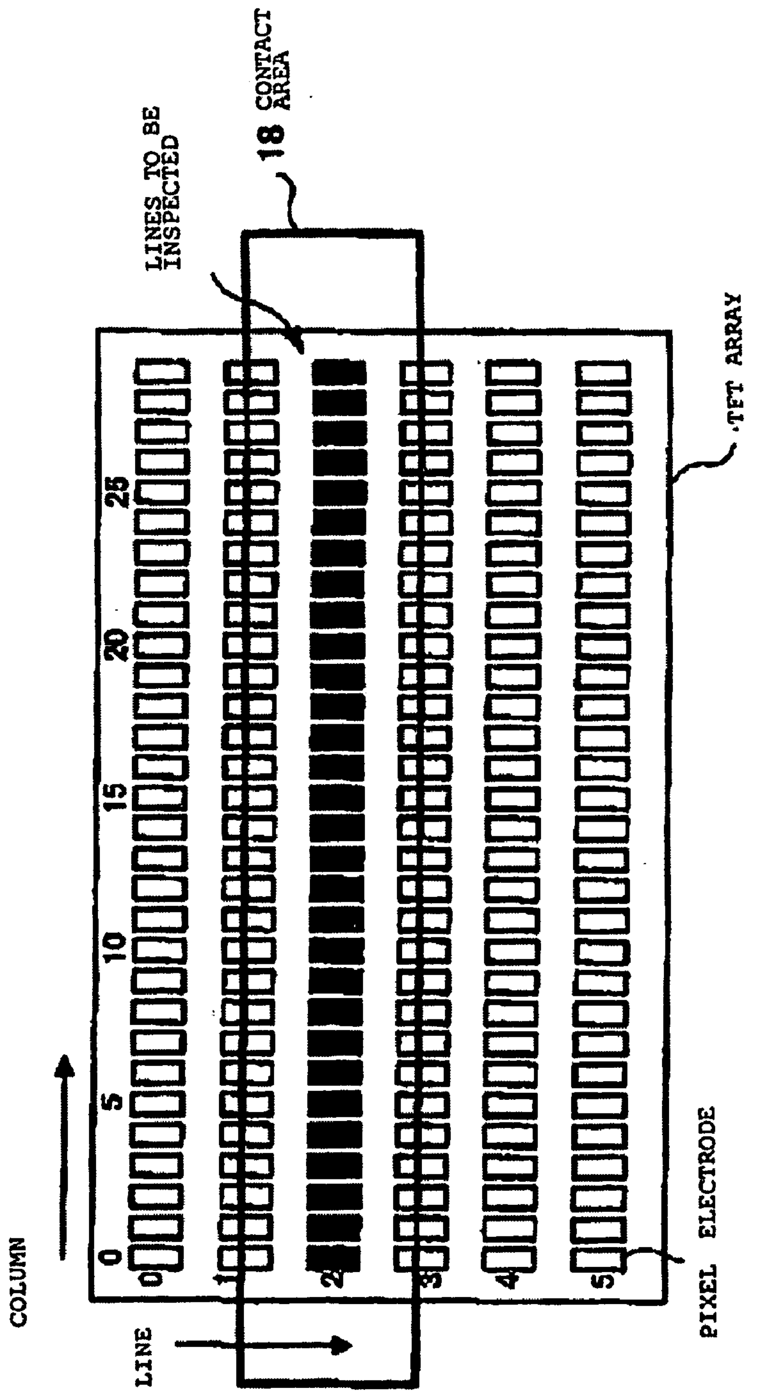
FIG. 11 is a diagram illustrating a state in which the roller contact probe is in normal contact with the pixel electrodes.
Figure 12A:
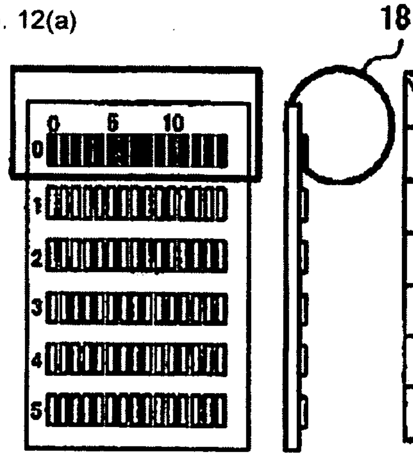
FIGS. 12(*a*) to 12(*c*) are diagrams to explain how the roller contact probe moves and inspection process proceeds in case of FIG. 11.
Figure 12B:
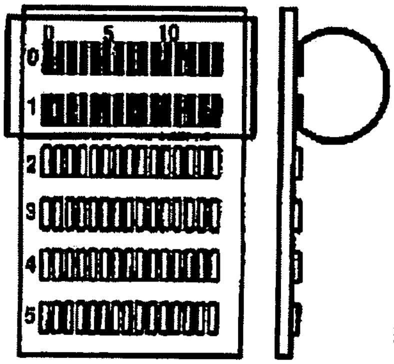
Figure 12C:
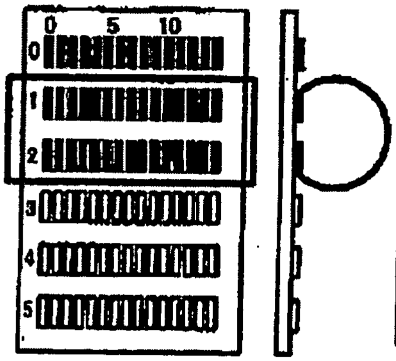
Figure 12D:
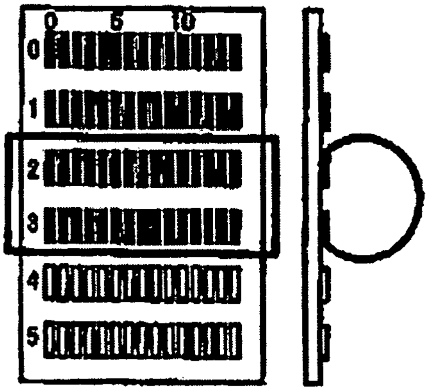
Figure 12E:
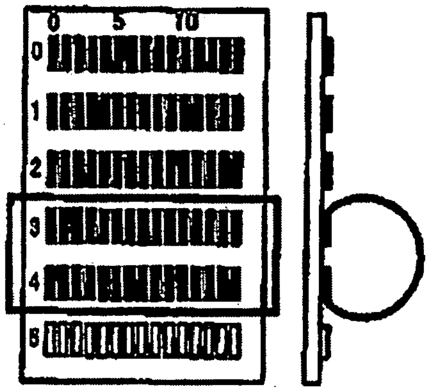
Figure 12F:
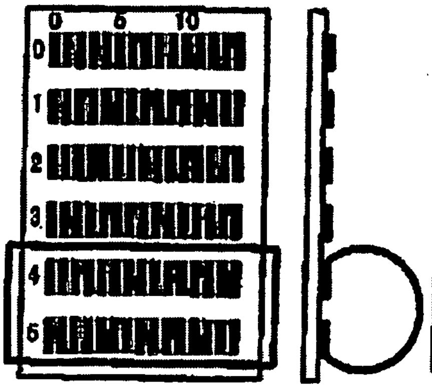
Figure 12G:
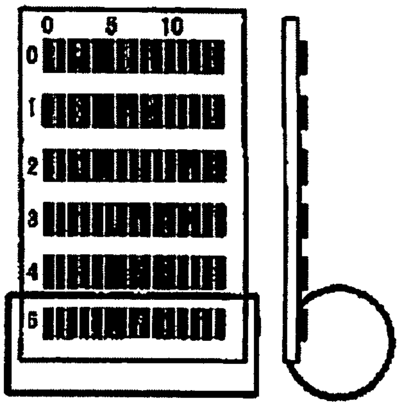

FIG. 11 is a diagram illustrating a state that the roller contact probe 18 is in normal contact with the pixel electrodes. When the roller contact probe 18 is caused to contact scores of pixel electrodes at a time, it is desirable to cause the probe to be able to contact all of those pixel electrodes to be inspected, as shown in FIG. 11. In the example shown in FIG. 11, the roller contact probe 18 is disposed in parallel to a line along which the pixel electrodes are arranged and further the roller contact probe 18 does not have damage and the like on the contact surface thereof. Note that for a simplified explanation, columns are shown in a range from 0 to 29 and lines are shown in a range from 0 to 5.

FIGS. 12(*a*) to 12(*g*) are diagrams to explain how the roller contact probe 18 moves and inspection process proceeds in the case of FIG. 11. In each of FIGS. 12(*a*) to 12(*g*), the figure on the left shows an area that the roller contact probe 18 contacts. In this case, the lines (0 to 5) are shown as extending in a longitudinal direction and the columns (0 to 14) are shown as extending in a lateral direction. The figure in the center shows a state that the panel and the roller contact probe 18 are viewed from the sides thereof. The figure on the right shows an example of a map of the number of measurements, which map is produced, for example, by the control circuits 13 and the first line on a table carries column numbers in a lateral direction and the first column on the table carries line numbers in a longitudinal direction. The map of the number of measurements shows how many times measurement of current has been performed on each of the pixel circuits. FIGS. 12(*a*) to 12(*g*) illustrate a case where the roller contact probe 18 is able to contact two lines of pixel electrodes at a time.

FIG. 12(*a*) shows a state where current to be determined by measuring the line 0 is observed and current to be determined by measuring the line 1 is not observed. Such a state indicates that the roller contact probe 18 has been disposed on a measurement start line at which measurement starts. A start pulse is inputted to the select line driver circuit while the roller contact probe 18 is moved. As shown in FIG. 12(*b*), the second measurement of the line 0 and the first measurement of the line 1 are completed. Furthermore, an operation to input the start pulse to the select line driver circuit while moving the roller contact probe 18 is repeated. FIG. 12(*c*) shows a state where the second measurement of the line 1 and the first measurement of the line 2 have been completed, FIG. 12(*d*) shows a state where the second measurement of the line 2 and the first measurement of the line 3 have been completed, FIG. 12(*e*) shows a state where the second measurement of the line 3 and the first measurement of the line 4 have been completed, and FIG. 12(*f*) shows a state where the second measurement of the line 4 and the first measurement of the line 5 have been completed. Finally, as shown in FIG. 12(*g*), when the second measurement of the line 5 is completed, measurements of all of the lines are completed. When the measurements of all of the lines are completed and the value obtained by measuring a pixel is undesirable, the pixel can be determined to be abnormal.

It should be noted that the table (map) shown in the figure on the right of each of FIGS. 12(*a*) to 12(*g*) is presented, for example, on a display (not shown) provided in the computer 12 of the test system 10 shown in FIG. 1. Moreover, when the table is prepared so that the table contains elements that indicate abnormality and only locations of the elements are highlighted on the display upon display of the table, an inspection operator is able to easily perform determination.

Figure 13:
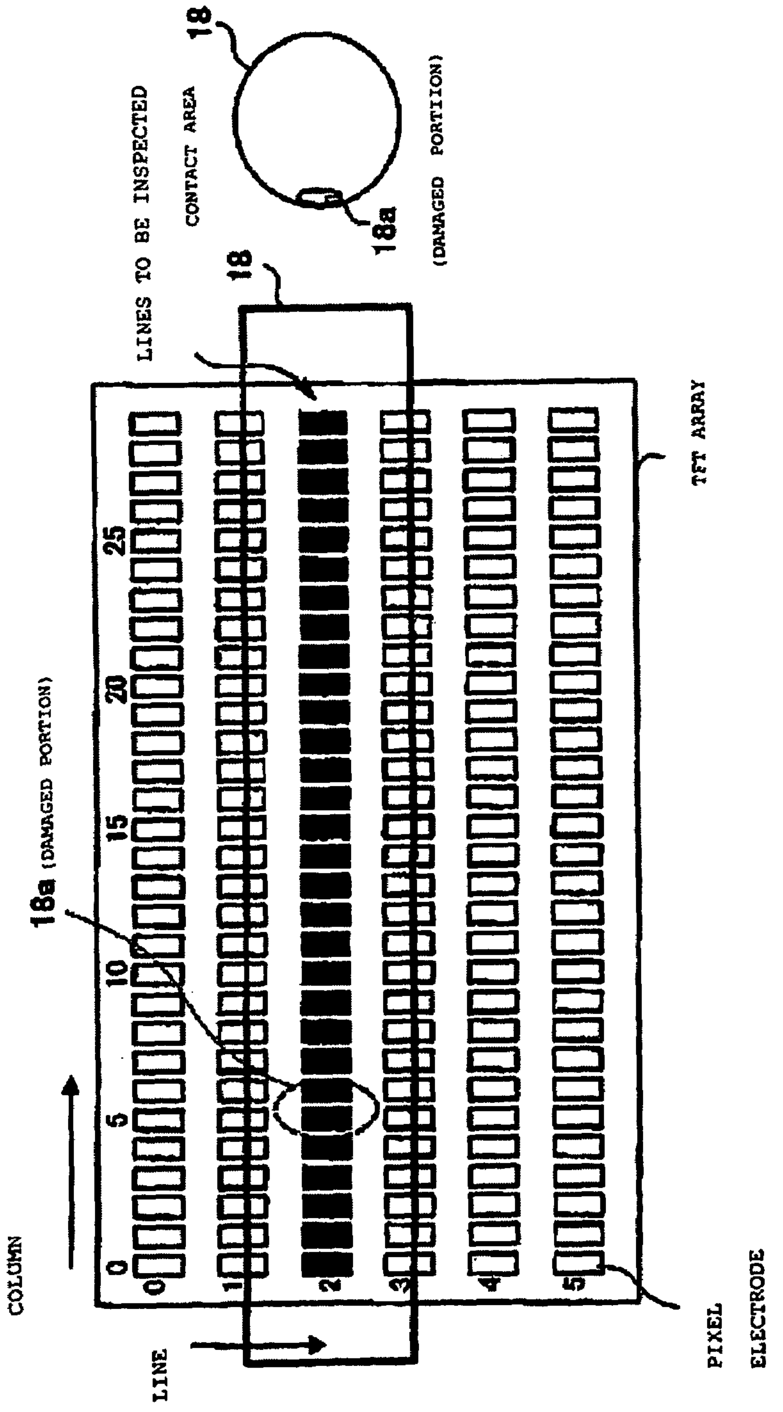
FIG. 13 is a diagram illustrating an example in which the roller contact probe includes a damaged portion in a part of the contact surface of the probe and contact with pixel electrodes cannot be made at the damaged portion.
Figure 14A:
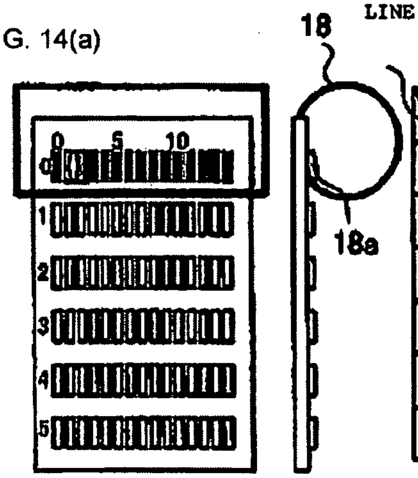
FIGS. 14(*a*) to 14(*c*) are diagrams to explain how the roller contact probe moves and inspection process proceeds in the case shown in FIG. 13.
Figure 14B:
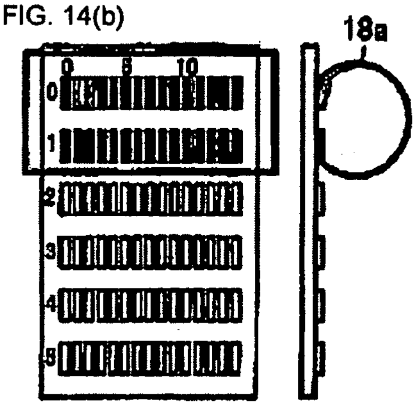
Figure 14C:
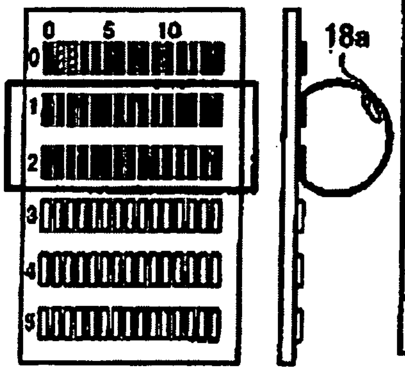
Figure 14D:
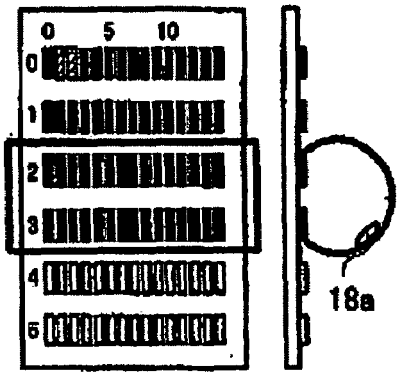
Figure 14E:
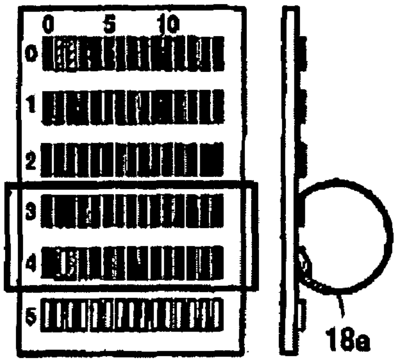
Figure 14F:
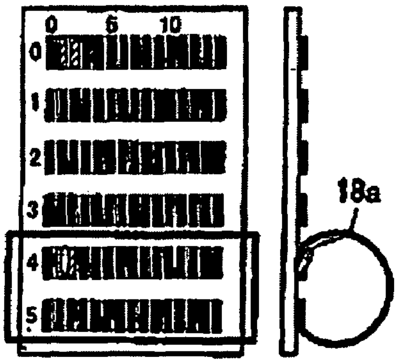
Figure 14G:
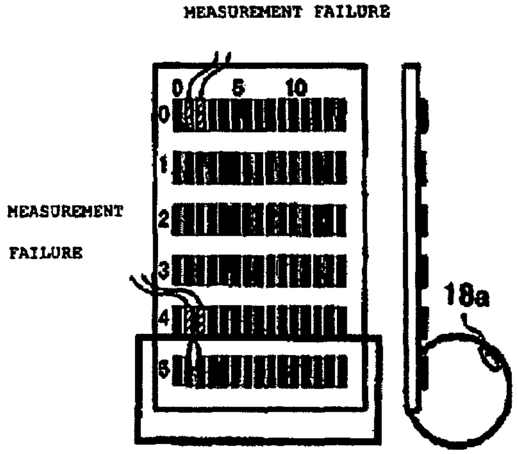

FIG. 13 is a diagram illustrating an example in which the roller contact probe 18 includes a damaged portion 18*a* in a part of the contact surface of the probe and contact cannot correctly be made to the pixel electrodes owing to the damaged portion 18*a*. Referring to FIG. 13, similarly to FIG. 11 and the like, axis of abscissas and lines denotes the column numbers and axis of ordinate denotes the line numbers, and a state where the roller contact probe 18 is moved to the second line is shown. As shown in the example of FIG. 13, contact cannot be correctly made at intersections of the line 2 and the columns 5 and 6. When contact is not being correctly made, current does not flow through the driver TFT upon inspection of pixel circuits and therefore the corresponding pixel circuit might be determined by the inspection device to be defective. According to the embodiment, even when such trouble occurs, the inspection system is advantageously able to detect occurrence of contact failure.

FIGS. 14(*a*) to 14(*g*) are diagrams to explain how the roller contact probe 18 moves and inspection process proceeds in the case shown in FIG. 13. Arrangement of those constituent figures is the same as that of FIG. 12 and therefore explanation thereof is omitted. When process proceeds in accordance with the above-described inspection flow, due to the existence of the damaged portion 18*a*, shown in FIG. 13, of the roller contact probe 18, the columns 1 and 2 in the line 0 (0th line) in the example shown in FIG. 14(*a*) cannot be in correct contact with the probe. Accordingly, as shown in FIG. 14(*a*), the column 1 in the line 0 (0th line) and the column 2 in the line 0 cannot be correctly measured. Even when the roller contact probe 18 has moved to the position shown in FIG. 14(*b*) and the number of measurement and the like, numeral "2", should have been stored in the line 0, the column 1 in the line 0 and the column 2 in the line 0 remain indicating numeral "0". Likewise, as shown in FIG. 14(*e*) and FIG. 14(*f*), due to the existence of the damaged portion 18*a*, the column 1 in the line 4 and the column 2 in the line 4, both of which correspond to locations on which measurement cannot be correctly performed, are encountered. As described above, when damaged portions exist in the roller contact probe 18, locations of defects periodically repeated depending on the diameter of the roller can be detected from the map of the number of measurements. That is, as shown in FIG. 14(*g*), when the locations of defects, which locations are detected in a direction of rotation of the roller contact probe 18, coincide with a period corresponding to the outer peripheral length of the roller, the fact that the roller contact probe 18 includes abnormalities can be identified, allowing measurement failure due to abnormalities in the pixel circuits to be discriminated from the abnormalities in the probe. Note that although the detection of abnormalities can easily be performed by an inspection operator who views the table presented on the display, etc., for determination, the embodiment may also, for example, be configured so that the computer 12 shown in FIG. 1 automatically identifies periodic indication of existence of abnormalities and displays, as an output, the cause of abnormalities.

Figure 15:
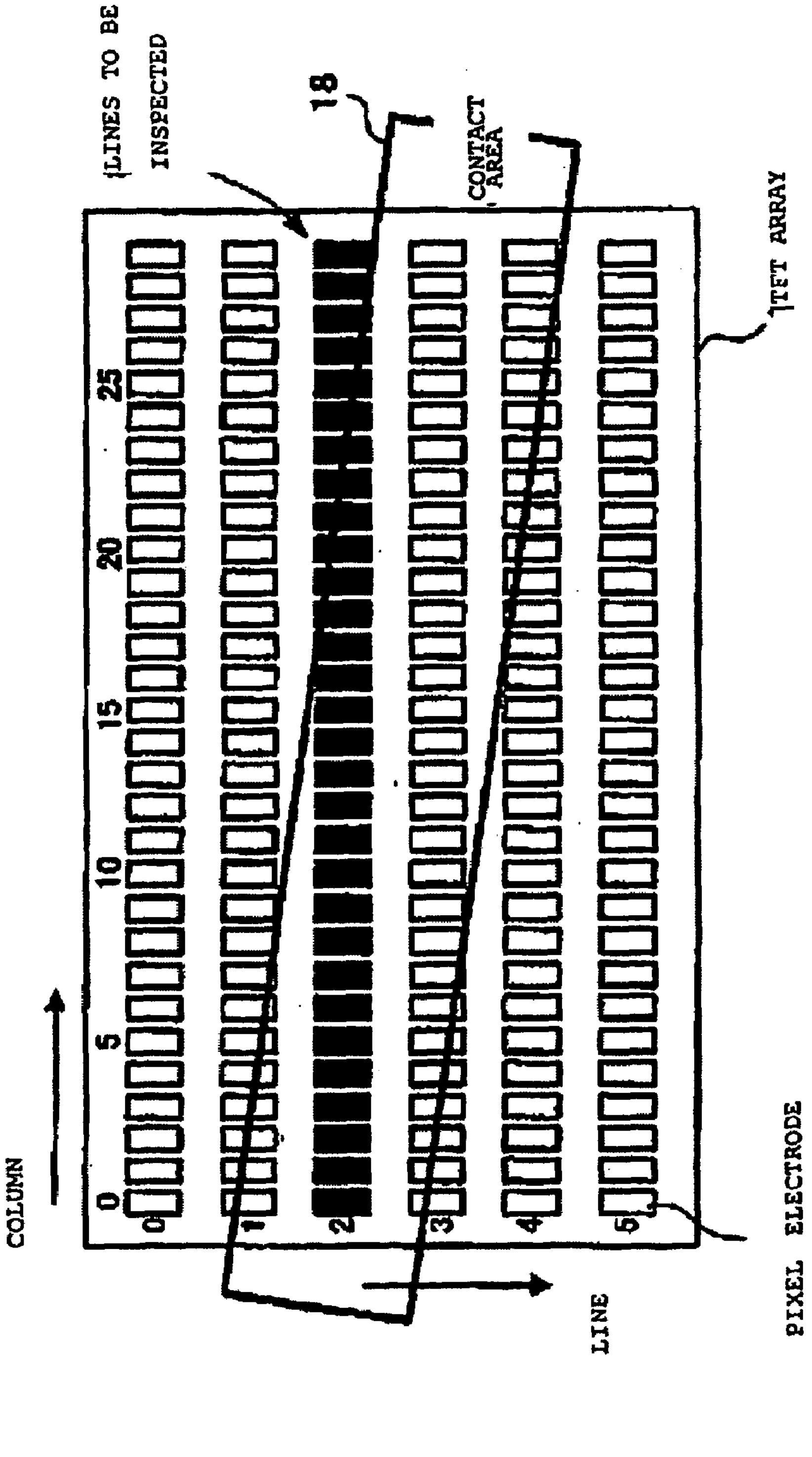
FIG. 15 illustrates a case where a TFT array substrate to be measured is disposed obliquely relative to the roller contact probe.
Figure 16A:
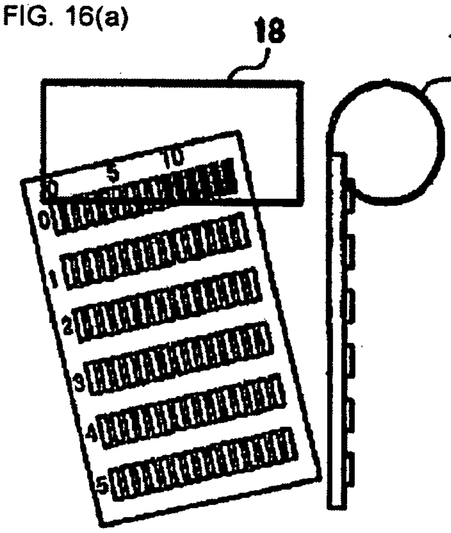
FIGS. 16(*a*) to 16(*c*) are diagrams to explain how the roller contact probe moves and inspection process proceeds in the case shown in FIG. 15.
Figure 16B:
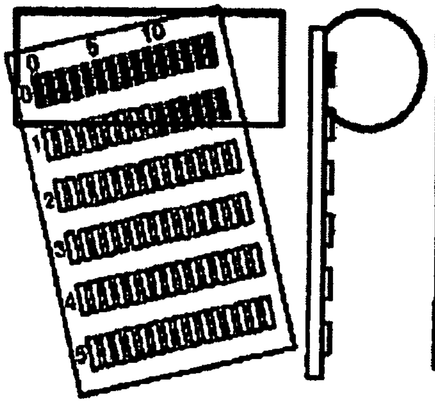
Figure 16C:
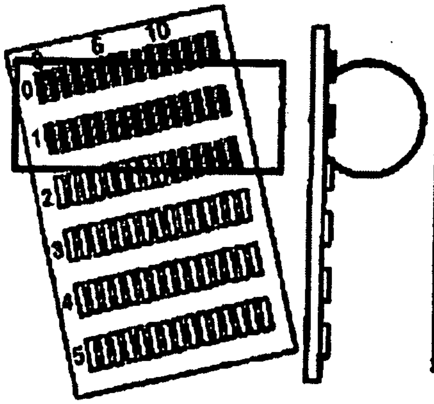
Figure 16G:
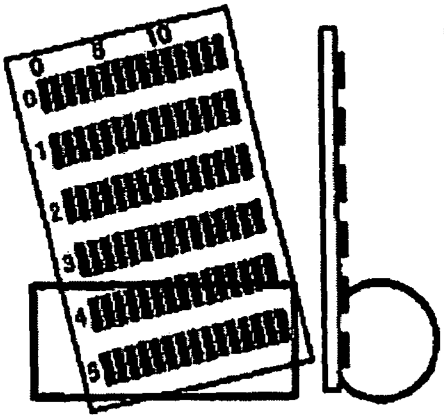
Figure 16H:
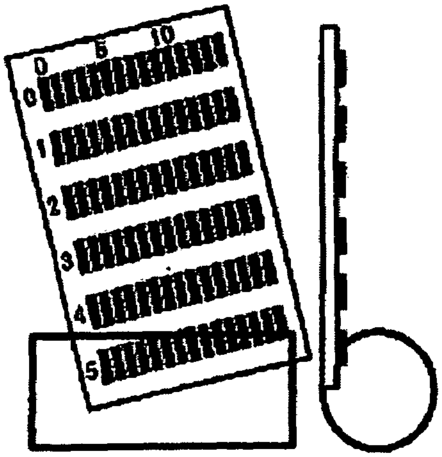

FIG. 15 illustrates a case where the TFT array substrate to be measured is disposed obliquely relative to the roller contact probe 18. As shown in the example of FIG. 15, since the roller contact probe 18 and the TFT array substrate are angularly displaced from their normal positions, the columns 27 to 29 in the line 2 are not in contact with the roller contact probe 18. Furthermore, it is probable that the columns 19 to 26 in the line 2 also are not in contact with the probe.

FIGS. 16(*a*) to 16(*g*) are a diagram to explain how the roller contact probe 18 moves and inspection process proceeds in the case shown in FIG. 15. Arrangement of those constituent figures is the same as that of FIG. 12 and therefore explanation thereof is omitted. When process proceeds in accordance with the above-described inspection flow, for example, in FIG. 16(*a*), due to angular displacement, only the columns 10 to 14 in the line 0 are in normal contact with the probe and the fact that the map of the number of measurements indicates that only the pixel circuits corresponding to the above-stated columns provide an output can be observed. As shown in FIG. 16(*b*), the fact that measurement has been performed two times on the columns 9 to 14 in the line 0 can be observed and the fact that measurement has been performed one time on the columns 0 to 8 in the line 0 and the columns 9 to 14 in the line 1 can be observed. As shown in FIG. 16(*c*), the fact that measurement has been performed two times on all pixels in the line 1 and the columns 9 to 14 in the line 1 can be observed and the fact that measurement has been performed one time on the columns 0 to 8 in the line 1 and the columns 9 to 14 in the line 2 can be observed. Likewise, as shown in FIG. 16(*d*), the fact that measurement has been performed two times on all pixels in the lines 0 and 1, and the columns 9 to 14 in the line 2 can be observed and the fact that measurement has been performed one time on the columns 0 to 8 in the line 2 and the columns 9 to 14 in the line 3 can be observed. In FIGS. 16(*e*) to 16(*g*), the fact similar to that described above can be observed in such a manner that lines on which measurement has been performed are shifted one by one from the lines shown in FIG. 16(*d*). Finally, when the roller contact probe 18 and the TFT array substrate are in the state shown in FIG. 16(*h*), the fact that measurement has been performed two times on all pixels is stored in the map of the number of measurements. That is, even when the roller contact probe 18 and the TFT array substrate are angularly displaced from their normal positions and further when the roller contact probe 18 has a length entirely covering the corresponding length of the oblique TFT array substrate, it could be appreciated that measurement can be performed without any disturbance. Thus, according to the embodiment, the need for accurate control of angular arrangement of those components becomes unnecessary.

Subsequently, an example of a TFT array substrate to be measured and a drive waveform used to inspect individual pixels will be explained.

Figure 17:
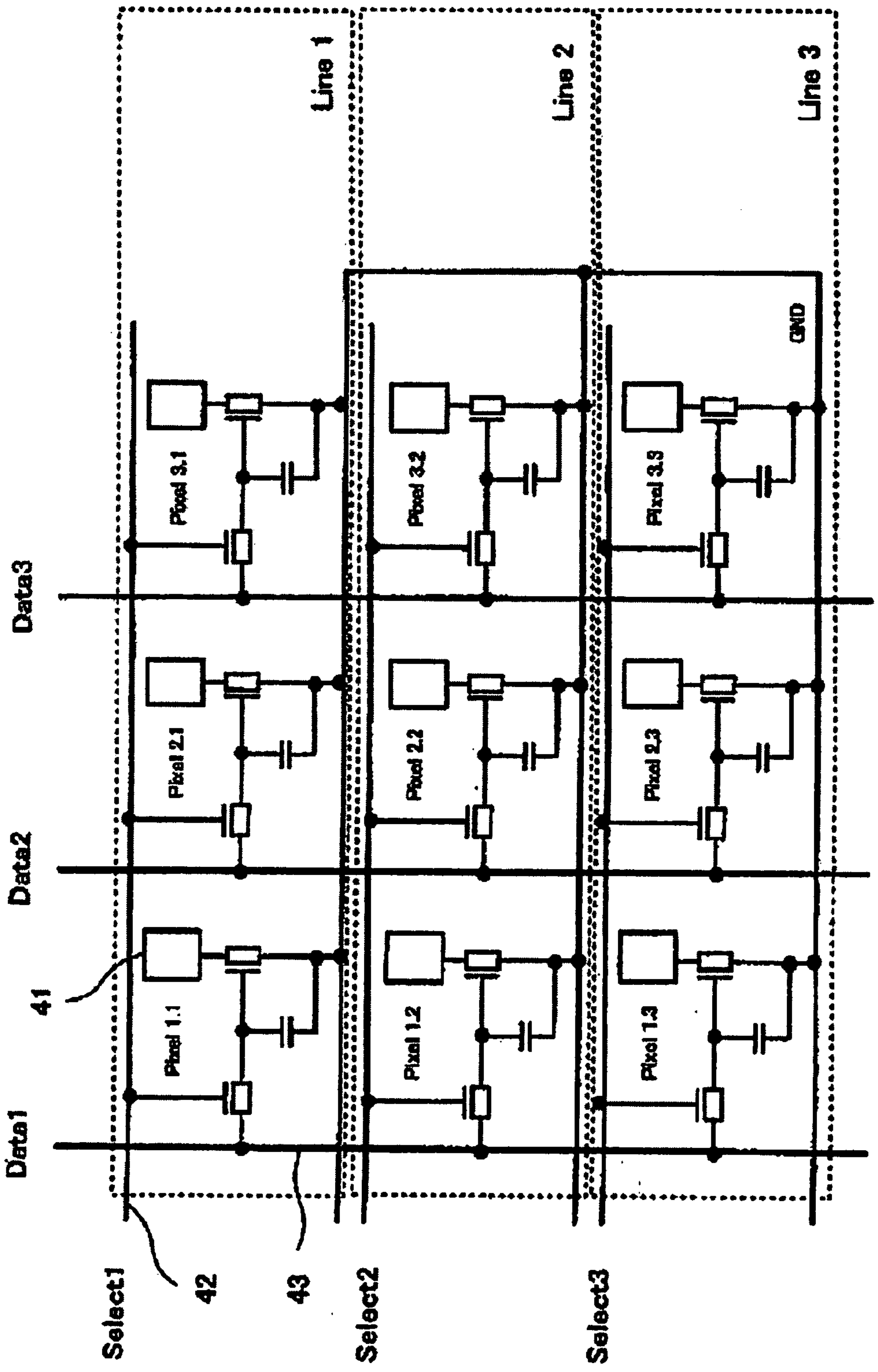
FIG. 17 is a diagram illustrating arrangement of typical pixel circuits consisting of two TFTs.

FIG. 17 is a diagram illustrating arrangement of fundamental pixel circuits consisting of two TFTs. The roller contact probe 18 contacts the pixel electrodes 41 on which OLEDs are to be formed in a later step and serves as a power supply. In the example shown in FIG. 17, measurement of current is performed by the roller contact probe 18. FIG. 17 shows three select lines 41 denoted by select 1 to select 3 and three data lines 43 denoted by data 1 to data 3. Here, the case where the roller contact probe 18 moves from the line 1 to line 3 will be explained.

Figure 18:
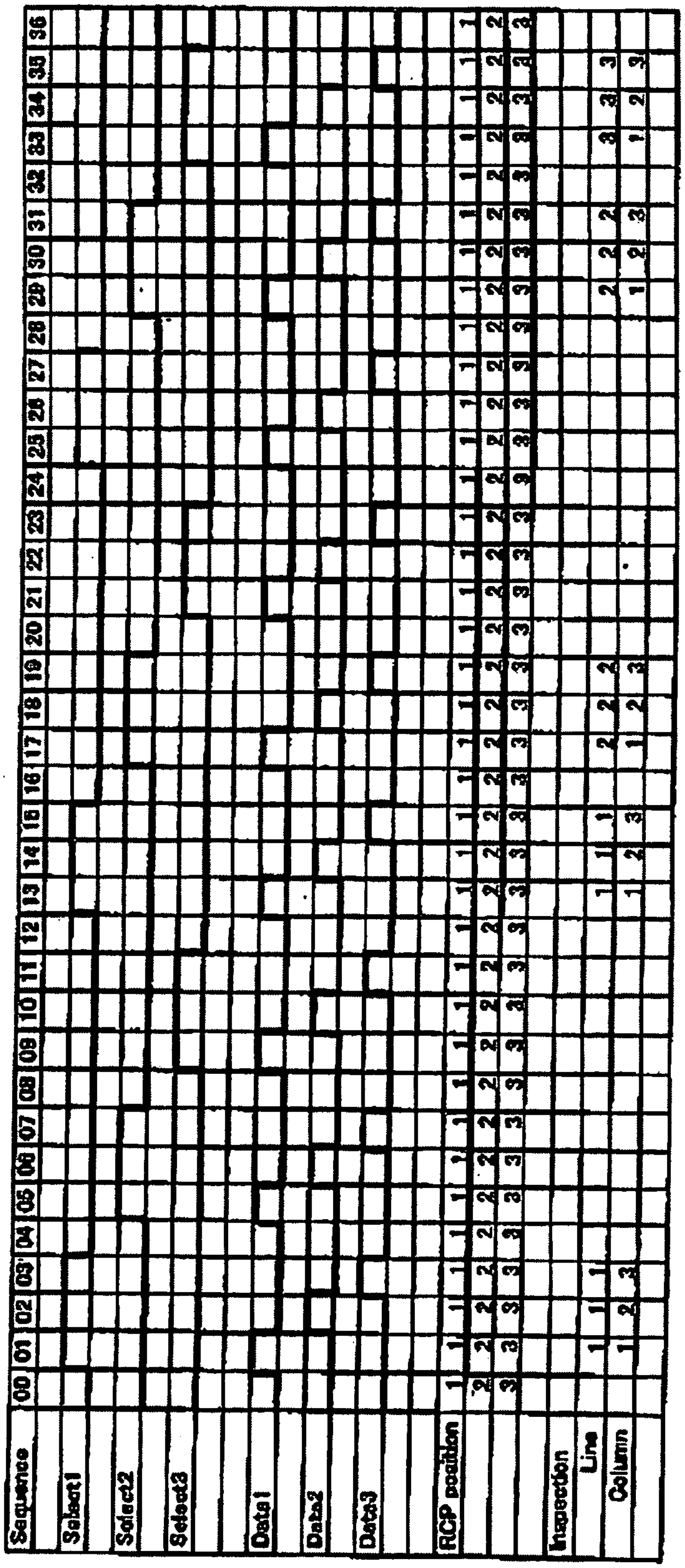
FIG. 18 is a diagram illustrating a drive waveform used to inspect individual pixels arranged as shown in FIG. 17.

FIG. 18 is a diagram illustrating drive waveforms used to inspect individual pixels arranged as shown in FIG. 17. The term"RCP Position" in the figure indicates the locations (line) of the pixel electrodes 41 with which the roller contact probe 18 is in contact. In a state where the roller contact probe 18 is mounted on the TFT array substrate shown in FIG. 17, the roller contact probe 18 moves from the line 1 to line 3 in synchronization with the scanning of lines while rotating. The roller contact probe 18 is moving at one-third the speed at which the select lines 42 are scanned. During sequence 00 to 12, the probe is in contact only with the line 1. Furthermore, during sequence 13 to 24, the probe is in contact with the line 1 and line 2. Still furthermore, during sequence 25 to 36, the probe is in contact with the line 2 and line 3. When the roller contact probe 18 is located on the line 1, the first measurement is performed on the columns 1, 2 and 3 in the line 1 by activating the data lines 43 and the like, the data 1 to data 3, during sequence 01 to 03 and the second measurement is performed on the columns 1, 2 and 3 in the line 1 during sequence 13 to 15. When the roller contact probe 18 is located on the line 2, the first measurement is performed on the columns 1, 2 and 3 in the line 2 during sequence 17 to 19 and the second measurement is performed on the columns 1, 2 and 3 in the line 2 during sequence 29 to 31. Thereafter, similarly to the above operation, inspection is performed on the pixel circuits in the individual lines. Thus, as shown such as in FIG. 12, the method according to the embodiment allows measurement to be performed two times on each of the columns.

Figure 19:
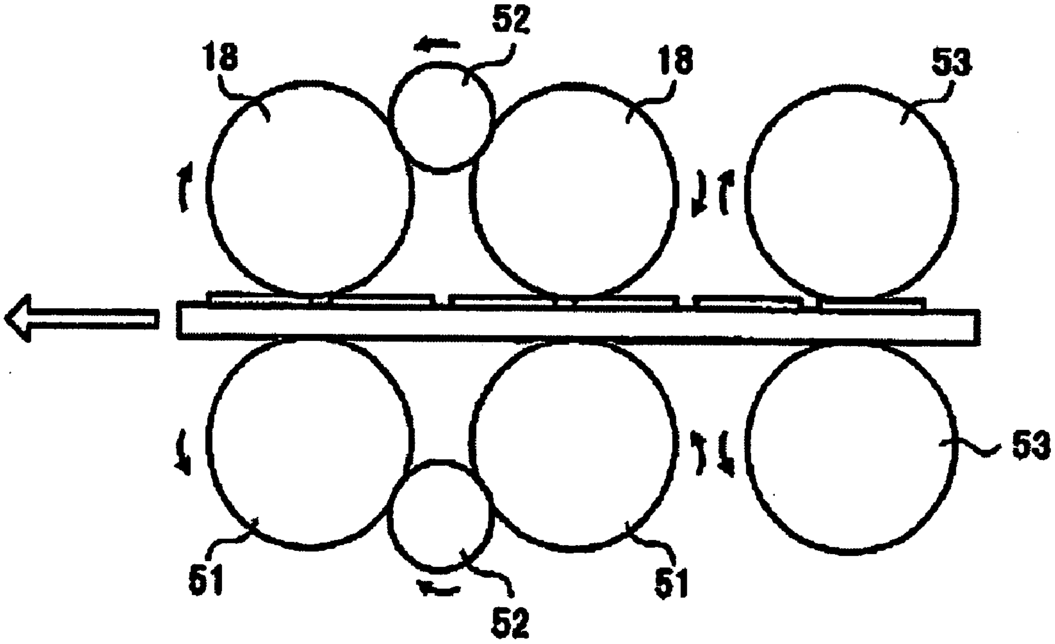
FIG. 19 shows an example of another embodiment.

FIG. 19 shows another embodiment in which two roller contact probes 18 are provided and together with the two roller contact probes 18, opposing rollers 51 interposing therebetween a TFT array substrate as a substrate to be inspected are provided. Furthermore, cleaning rollers 52 are operatively coupled between the two roller contact probes 18 and between the opposing rollers 51, respectively, to clean those probes and rollers. Moreover, panel cleaning rollers 53 are provided upstream of the TFT array substrate when viewing the substrate in a direction in which the substrate is conveyed, in order to clean the surface of the panel. In the example shown in FIG. 19, the combination and rotation of the two panel cleaning rollers 53, two roller contact probes 18 and two opposing rollers 51 allows the TFT array substrate to move while being interposed those rollers. In the aforementioned embodiment, although a method for moving the TFT array substrate and the roller contact probe 18 relatively to each other has been described and a method for moving the roller contact probe 18 on the TFT array substrate is employed, in addition to the method employed, a method for moving the TFT array substrate may be employed. In FIG. 19, movement of the TFT array substrate is denoted by an arrow. In the example shown in FIG. 19, supporting and pressuring the TFT array substrate are simultaneously performed. As shown in FIG. 19, disposing a plurality of roller contact probes 18 at a time allows inspection to be performed in a parallel fashion.

Finally, how an OLED panel is manufactured will be explained.

Figure 20:
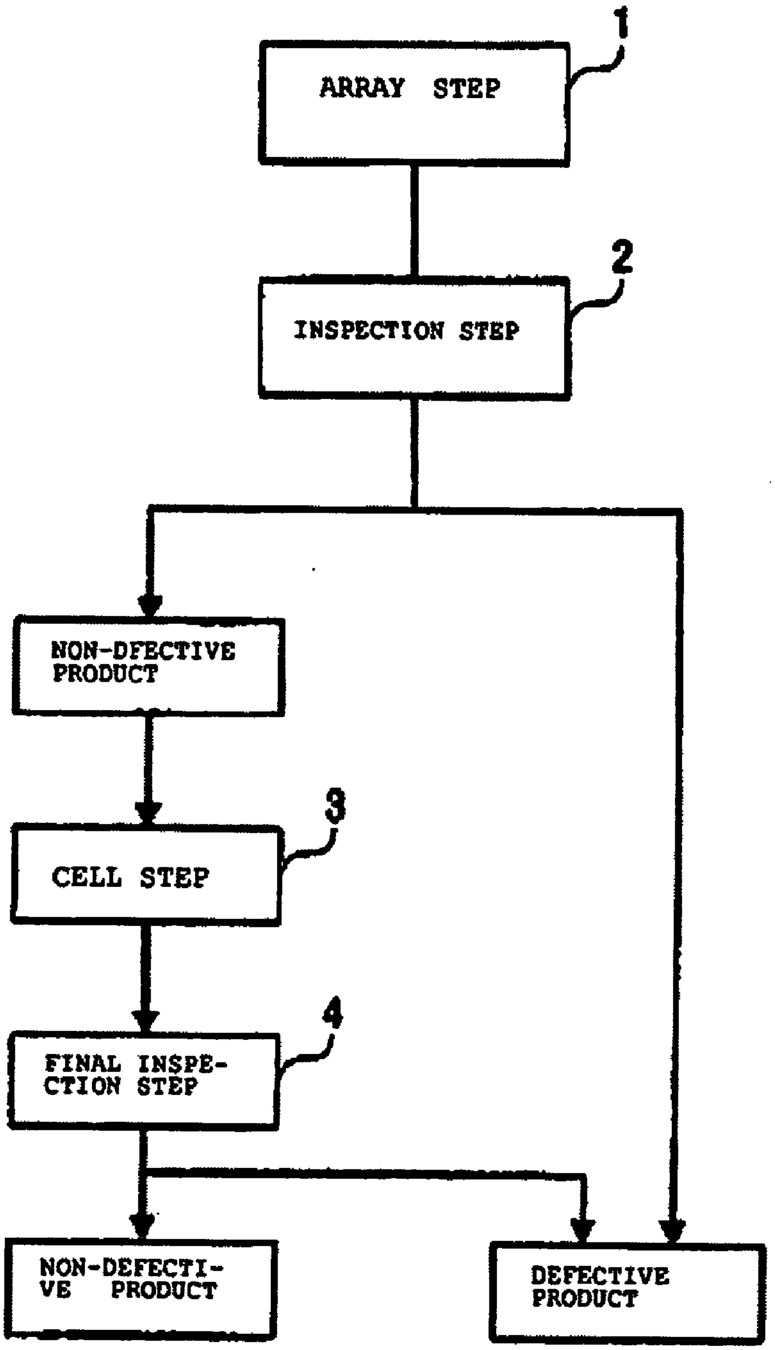
FIG. 20 is a diagram to explain the manufacturing steps of the OLED panel to which the embodiment is applied.

FIG. 20 is a diagram to explain the manufacturing steps of the OLED panel to which the embodiment is applied. A method for manufacturing an OLED panel to which the embodiment is applied includes an array step 1 of producing an active matrix panel on which TFT arrays constituting a drive circuit for driving OLEDs are formed and an inspection step 2 of performing functional test on the produced active matrix panel in a single form. In the inspection step 2, through use of the aforementioned inspection system and inspection method, whether the number of interconnects experiencing open or short failures is not greater than a predetermined value and whether electrical characteristics of TFTs are uniform over the panel are inspected. The active matrix panels determined to be defective in the inspection step are not subjected to the subsequent step and removed. The active matrix panels determined to be non-defective are subjected, through a cell step 3 of forming OLEDs on the TFT arrays, to a final inspection step 4. In the final inspection step, non-defective products and defective products are grouped into respective categories. In the embodiment, providing the inspection step 2 prior to the cell step 3 allows active matrix panels whose driver TFTs have large variations to be removed prior to forming OLEDs on the TFT arrays. Examples of a panel to be inspected include an active matrix (AM) panel used for a display screen of PHS, cellar phone, etc., as well as various AMOLED panels.

As described so far, according to the embodiment, the TFT arrays on which OLEDs are not formed can be effectively inspected while load on the arrays due to contact between the probe and the arrays is minimized and pressure is uniformly applied to the arrays. Since the roller contact probe 18 is able to directly supply current, inspection of characteristics (threshold voltage Vth, characteristic parameter β, capacitance value of pixel, or leakage) of a driver TFT within a pixel circuit can be securely performed. When such inspection of characteristics is performed on entire pixels of the panel, variations in characteristics of the panel can be determined and the use of the variations allows determination of whether the panel is non-defective or defective. This allows significant reduction in the number of defective panels passed to the subsequent step as well as reduction in manufacturing cost of panel. Furthermore, in a stage of development of panel, when the test system is used for determination of occurrence of failure, time span required for development can be expected to decrease.

Furthermore, according to the embodiment, measurement is performed while the map of the number of measurements is prepared and therefore locations with which the roller contact probe 18 is contact can be detected through the measurement. This allows a position control device for the roller contact probe 18 to have a simplified structure and further allows detection of pixel locations at which contact failure occurred. Furthermore, in a case where undesirable results are obtained as a result of measurement, since data is collected and statistically analyzed through the use of the map of the number of measurements, identification of whether the cause of the undesirable results is due to the defective pixel electrodes themselves or due to the defective probe becomes possible. When the cause is due to the defective probe, the probe is cleaned, repaired, replaced, etc., to allow inspection to be correctly and easily performed. Still furthermore, when a conductive rubber is disposed over the pixel area and then measurement is performed, it is necessary that one select line 42 has to be singly activated in any case. The reason for this is that when a plurality of select lines 42 are simultaneously activated, the unfavorable fact that currents flowing through a plurality of pixels are measured occurs. According to the embodiment, the roller contact probe 18 is in simultaneous contact with only about a few lines and further it is sufficient to activate one select line within the few lines. Accordingly, there is no need to wait until the shift register circuit of the select line driver circuit is washed out and therefore measurement time can also be reduced.

It should be appreciated that in the embodiment, the cylinder-shaped roller contact probe 18 has been employed as a rotatable probe, however, a probe made of an alternative rotatable member such as a sphere object may be employed. When a rotatable probe made of a sphere object is employed, it advantageously becomes possible to easily measure a curved display device like film while causing the probe to be in contact with pixel electrodes.

An exemplary application of the invention includes an inspection system for an active matrix panel mounting EL devices thereon, an inspection method for the same, and a display panel mounting EL devices thereon.

According to the invention, defects in pixel electrodes can be identified with high accuracy with regard to a substrate (active matrix panel) in which TFT arrays are arranged in a matrix.

Although the preferred embodiment of the present invention has been described in detail, it should be understood that various changes, substitutions and alternations can be made therein without departing from sprit and scope of the inventions as defined by the appended claims.

What is claimed is:

1. An active matrix panel inspection system for inspecting characteristics of an active matrix panel before formation of OLEDs (Organic Light Emitting Diodes), said active matrix panel inspection system comprising:

a rotatable probe having a conductive material in at least a surface thereof and sequentially contacting pixel electrodes formed on said active matrix panel while rotating;

voltage application means for applying a voltage necessary for measurement to TFT (Thin Film Transistor) arrays including pixel electrodes with which said rotatable probe is in contact;

current measurement means for measuring currents flowing through said TFT arrays to which a voltage is applied by said voltage application means; and abnormality detection means for detecting abnormalities in said rotatable probe by detecting periodically appearing conditions depending on a shape of said rotatable probe, by observing current using said current measurement means.

2. The active matrix panel inspection system according to claim 1, further comprising processing means for statistically processing results obtained by sequentially measuring currents by using said current measurement means.

3. The active matrix panel inspection system according to claim 2, wherein said processing means records the number of measurements performed on each of said TFT arrays by said current measurement meant.

4. The active matrix panel inspection system according to claim 1, wherein said rotatable probe comprises a roller-shaped member and has projections and depressions on a surface thereof.

5. The active matrix panel inspection system according to claim 4, wherein said projections and depressions of said rotatable probe have a shape of at least one of pyramid, sphere and trench.

6. The active matrix panel inspection system according to claim 1, wherein said rotatable probe comprises a roller-shaped member and is configured to be able to contact a plurality of pixel electrodes at a time.

7. The active matrix panel inspection system according to claim 1, wherein said rotatable probe comprises a sphere-shaped member.

8. The active matrix panel inspection system according to claim 1, wherein said rotatable probe is adapted to rotate in a direction of lines of active matrix panel.

9. The active matrix panel inspection system according to claim 1, wherein said rotatable probe comprises a control mechanism comprising any of a pressure mechanism, a position control mechanism, and a movement mechanism.

10. An active matrix panel inspection method for inspecting an active matrix panel before formation of OLEDs (Organic Light Emitting Diodes), said method comprising:

rotating a rotatable probe controlled so as to electrically serve as a power supply or a GND (ground) and of causing said rotatable probe to sequentially contact pixel electrodes of pixels to be measured on said active matrix panel;

scanning select lines provided to select lines on said active matrix panel;

applying a measurement voltage to data lines synchronizing with the scanning of said select lines;

observing current flowing through a driver TFT (Thin Film Transistor) of said pixel to be measured, said pixel allowing said measurement voltage to be applied thereto; and detecting abnormalities in said rotatable probe by detecting periodically appearing conditions depending on a shape of said rotatable probe, through observing current in the step of observing current.

11. The method according to claim 10, wherein in the step of observing current a plurality of measurement values are obtained by performing measurement a plurality of times on one of said pixels to be measured.

12. The method according to claim 11, further comprising:

mapping the number of measurements observed in the step of observing current; and identifying existence of abnormalities in pixel circuits constituting said active matrix panel through use of measurement results being mapped and/or abnormalities in said rotatable probe.

13. The method according to claim 10, further comprising configuring said rotatable probe is as a sphere-shaped member.

14. The method according to claim 10, further comprising rotating said rotatable probe in a direction of lines of active matrix panel.

15. The method according to claim 10, further comprising configuring said rotatable probe with a control mechanism comprising any of a pressure mechanism, a position control mechanism, and a movement mechanism.

16. An active matrix panel inspection method for inspecting an active matrix panel before formation of OLEDs (Organic Light Emitting Diodes), said method comprising:

causing a probe to sequentially contact pixel electrodes of pixels to be measured on said active matrix panel;

obtaining measurement results from measuring a plurality of times current flowing through said pixel, to be measured, which said probe contacts;

detecting abnormalities using results obtained from said plurality of measurements; and statistically processing said results of measurements and determining whether said detected abnormalities are due to defects in said pixels to be measured or due to defects in said probe, wherein the step of determining includes outputting a map of the number of measurements which is represented in a matrix of lines and columns.

17. The method according to claim 16, wherein, when said detected abnormalities are determined to be periodically repeated by a shape of said probe, through referring to said map of the number of measurements, the determining step determines that said detected abnormalities come from abnormalities in said probe.

18. The method according to claim 16, further comprising configuring said rotatable probe is as a sphere-shaped member.

19. The method according to claim 16, further comprising rotating said rotatable probe in a direction of lines of active matrix panel.

20. The method according to claim 16, further comprising configuring said rotatable probe with a control mechanism comprising any of a pressure mechanism, a position control mechanism, and a movement mechanism.

* * * * *